(12) United States Patent
Shearn et al.

(10) Patent No.: US 8,557,613 B2
(45) Date of Patent: Oct. 15, 2013

(54) METHODS FOR DESIGNING, FABRICATING, AND PREDICTING SHAPE FORMATIONS IN A MATERIAL

(75) Inventors: Michael Shearn, San Antonio, TX (US); Michael David Henry, Albuquerque, NM (US); Axel Scherer, Woodstock, VT (US)

(73) Assignee: California Institute of Technology, Pasadena, CA (US)

( * ) Notice: Subject to any disclaimer, the term of this patent is extended or adjusted under 35 U.S.C. 154(b) by 106 days.

(21) Appl. No.: 13/159,335

(22) Filed: Jun. 13, 2011

(65) Prior Publication Data

US 2012/0264237 A1 Oct. 18, 2012

Related U.S. Application Data

(63) Continuation-in-part of application No. 12/824,128, filed on Jun. 25, 2010.

(60) Provisional application No. 61/354,619, filed on Jun. 14, 2010, provisional application No. 61/364,987, filed on Jul. 16, 2010.

(51) Int. Cl.
*H01L 21/00* (2006.01)

(52) U.S. Cl.
USPC ............ 438/8; 438/9; 438/634; 438/705; 438/706; 438/714; 438/733; 438/735; 438/740; 257/E21.218; 257/E21.219; 257/E21.246; 257/E21.529; 216/62; 216/87; 977/741; 977/749; 977/758

(58) Field of Classification Search
None
See application file for complete search history.

(56) References Cited

U.S. PATENT DOCUMENTS

2006/0223324 A1* 10/2006 Ikegami ................ 438/700
2010/0065941 A1 3/2010 Wells et al.

OTHER PUBLICATIONS

Qian et al. ("Fabrication of Si microstructures using focused ion beam implantation and reactive ion etching," J. Micromech. Microeng 18, 035003, pp. 1-5, 2008).*
Chekurov et al. ("The fabrication of Silicon Nanostructures by Local Gallium Implantation and Cryogenic Deep Reactive Ion etching," Nanotechnology 20, 065307, pp. 1-5, Jan. 2009).*
Henry et al. ("Alumina etch masks for fabrication of high-aspect-ration silicon micropillars and nanopillars," Nanotechnology 20, 255305, pp. 1-4, 2009).*
Eichenfield, M., et al., Optomechanical crystals, Nature 2009, 462: 78-2.
Ekinci, KL, et al., Nanoelectromechanical systems, Review of Scientific Instruments 2005, 76: 061101-1-061101-12.
Henry, MD et al., Ga+ beam lithography for nanoscale silicon reactive ion etching, Nanotechnology 2010, 21: 245303-1-245303-8.
Hoshikawa, T . et al., Relationship between Gallium Concentration and Resistivity of Gallium-Doped Czochralski Silicon Crystals: Investigation of a Conversion Curve, Japanese J. Appl. Phys. 2008, 47: 8691-8695.

(Continued)

*Primary Examiner* — Yasser Abdelaziez
(74) *Attorney, Agent, or Firm* — Steinfl & Bruno LLP

(57) ABSTRACT

A method for designing, fabricating, and predicting a desired structure in and/or on a host material through defining etch masks and etching the host material is provided. The desired structure can be micro- or nanoscale structures, such as suspended nanowires and corresponding supporting pillars, and can be defined one layer at a time. Arbitrary desired structures can also be defined and obtained through etching. Further, given the desired structure, a starting structure can be predicted where etching of the starting structure yields the desired structure.

17 Claims, 32 Drawing Sheets

(56) References Cited

OTHER PUBLICATIONS

Lugstein, A. et al., FIB processing of silicon in the nanoscale regime, Appl. Phys. A 2003, 76: 545-548.
Mellhaoui, X. et al., $SiO_xf_y$ passivation layer in silicon cryoetching, J. Appl. Phys. 2005, 98: 104901-1-104901-10.
Olesinski, RW et al., The Ga-Si (Gallium-Silicon) System, Bulletin of the Alloy Phase Diagrams 1985, 6: 362-364.
Sievila, P. et al., The fabrication of silicon nanostructures by focused-ion-beam implantation and TMAH wet etching, Nanotechnology 2010, 21: 145301-1-145301-6.
Tachi, S. et al., Low-temperature reactive ion etching and microwave plasma etching of silicon, Appl. Phys. Letters 1988, 52: 616-618.
Restriction Requirement mailed on Oct. 17, 2012 for U.S. Appl. No. 12/824,128, filed Jun. 25, 2010 in the name of Michael David Henry et al.
Notice of Allowance + Interview Summary mailed on Jan. 11, 2013 for U.S. Appl. No. 12/824,128, filed Jun. 25, 2010 in the name of Michael David Henry et al.
Notice of Allowance mailed on Apr. 2, 2013 for U.S. Appl. No. 12/824,128, filed Jun. 25, 2010 in the name of Michael David Henry et al.

* cited by examiner

METHODS FOR DESIGNING, FABRICATING, AND PREDICTING SHAPE FORMATIONS IN A MATERIAL

CROSS REFERENCE TO RELATED APPLICATIONS

The present application is a continuation-in-part of U.S. application Ser. No. 12/824,128, entitled "Method for Fabricating Micro and Nanostructures in a Material", filed on Jun. 25, 2010, which, in turn, claims priority to U.S. Provisional Application No. 61/220,982, entitled "Etch Masking using Implanted Ions", filed on Jun. 26, 2009, the disclosure of each of which is incorporated herein by reference in its entirety. The present application also claims priority to U.S. Provisional Application No. 61/354,619, entitled "Nanowires and Nanobeams Defined via Ion Implantation", filed on Jun. 14, 2010, and to U.S. Provisional Application No. 61/364,987, entitled "Etch Masking of Carbon using Implanted Ions", filed on Jul. 16, 2010, the disclosure of each of which is incorporated herein by reference in its entirety.

STATEMENT OF GOVERNMENT GRANT

This invention was made with government support under Grant No. HR0011-04-1-0054 awarded by DARPA, Grant No. DMR-0120967 awarded by the NSF, and Grant No. EEC-0812072 awarded by the NSF. The government has certain rights in the invention.

FIELD

The present disclosure relates to methods for fabricating structures in a material. In particular, it relates to methods for designing, fabricating, and predicting shape formations in a material.

BACKGROUND

A cornerstone of silicon fabrication is the ability to pattern a structure on a planar silicon surface and subsequently use this pattern as a mask to etch the structure in the silicon.

Fabrication of structures in or on a host material has been ubiquitous in industries such as the semiconductor industry. However, fabrication of microscale and nanoscale structures is still challenging.

SUMMARY

According to a first aspect of the disclosure, a method for fabricating a desired structure in and/or on a host material is provided, comprising: providing shapes to define the desired structure in and/or on the host material; defining one or more etch masks in and/or on the host material via addition or removal of a masking material according to each of the shapes; and etching the host material with an etch chemistry to fabricate the desired structure, wherein the etch chemistry selectively etches the host material with respect to the one or more etch masks and selectively etches regions of the host material associated with at least one shape in the desired structure but absent the one or more etch masks.

According to a second aspect of the disclosure, a method for predicting a starting structure from a desired structure is provided, wherein the desired structure is obtained from the starting structure through an etching process, the method comprising: a) defining an experimental structure through an experimental set of etch masks; b) etching, using a set of etching parameters, the experimental structure to obtain an intermediate structure; c) comparing the intermediate structure with the desired structure based on an objective function, wherein the objective function is a function of a difference between corresponding points in the intermediate structure and the desired structure; d) adjusting at least one of the set of etching parameters and the experimental set of etch masks based on the comparing; and e) repeating a) through d) to approximate the starting structure until one or more criteria are satisfied, wherein etching parameters comprise etch chemistry, etch time, temperature, and pressure, and wherein the one or more criteria comprises a set number of iterations, a value for the objective function, or a combination thereof.

The methods and systems herein described can be used in connection with semiconductor technology and various additional applications, identifiable by a skilled person upon reading of the present disclosure, wherein fabrication of micro- and/or nanostructure on or in a material is desirable.

The details of one or more embodiments of the disclosure are set forth in the accompanying drawings and the description below. Other features, objects, and advantages will be apparent from the description and drawings, and from the claims.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIGS. 13B and 13C show Si—Ga systems where gallium, the masking material, is deposited in or on, respectively, silicon, the host material.

FIG. 25E shows current-voltage curves for wires of different sizes while

FIG. 28A shows CNT bundles implanted with gallium via ion implantation and etched using an O$_2$ plasma etch. FIG. 28B shows CNT bundles implanted with gallium and etched to a 14.5 µm tall mesa. FIG. 28C shows CNT bundles implanted with different doses of gallium, with lower doses toward the left and higher doses toward the right.

DETAILED DESCRIPTION

Figure 1:
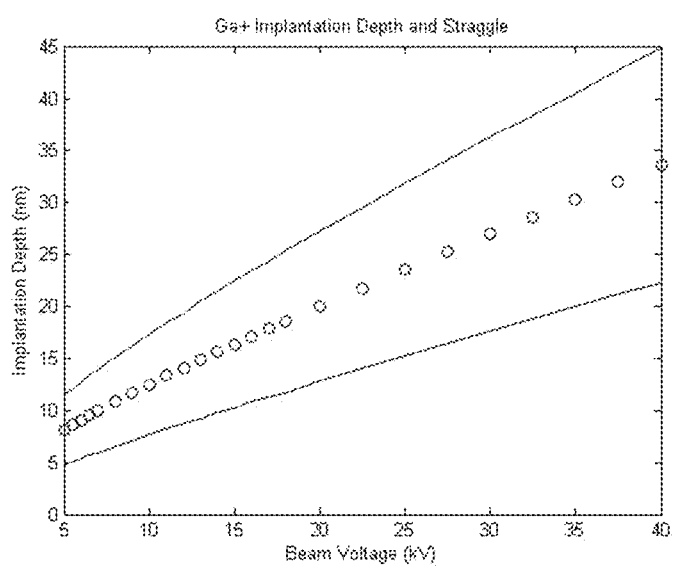
FIG. 1 shows an exemplary $Ga^+$ implantation depth for varying focused ion beam (FIB) voltages according to an embodiment herein described. The etch mask thickness is approximated by two times the straggle length.

Methods and systems are herein described for fabricating structures in or on a substrate through etch masking that in various embodiments allow control of the etching process and the high fidelity and resolution of the fabricated structure of a micro and nano dimensions.

As used in this disclosure, the term "host material", which can also be referred to as substrate material or simply substrate, refers to the material in or on which etch masks will be placed. Etch masks can be placed in the host material through, for example, diffusion and/or ion implantation. Etch masks can be placed on the host material through, for example, deposition of the etch masks onto the host material, such as or similar in manner to that of depositing a layer of photoresist on top of silicon substrate. By way of example and not of limitation, deposition of the host material can be performed using chemical vapor deposition (CVD), thermal evaporation, atomic layer deposition, and sputtering.

Exemplary host materials generally include a group IV element or a compound of a group IV element. For instance, exemplary host materials include silicon, silicon carbide, silica, silicon nitride, silicon-germanium, germanium, amorphous carbon, graphite, diamond, carbon nanotubes, organic compounds, photoresists, and polydimethylsiloxane (PDMS). Other metals such as tungsten can also be used as the host material.

The term "mask" or "etch mask" refers to a layer of masking material that is added into or onto the host material. The masking material generally involves an element or a compound not significantly etched by an etching chemistry. For instance, exemplary masking materials include group III elements such as gallium (Ga), indium (In), gold (Au), boron (B), and aluminum (Al). A skilled person would be able to identify additional materials suitable for use as the masking material for a particular host material and a particular etching chemistry.

It should be noted that a material that is the host material in one host material-masking material system can be the masking material in another system. By way of example and not of limitation, in one system, silicon can be the host material while gallium can be the masking material. In another system, carbon can be the host material while silicon can be the masking material.

Selection of the masking material depends on application in which the masking material will be utilized. Similarly, the selection depends on parameters of an etcher, such as parameters of an induced coupled plasma reactive ion etcher (ICP-RIE). Parameters of the ICP-RIE etcher include, but are not limited to, operating temperature, etch chemistry, and plasma power.

Materials generally etch differently (or not at all) depending on temperature, and some materials only etch above a certain temperature. Some applications involve temperatures that remain within a specified range during etching. Consequently, not all materials are suitable for a given application.

Etch chemistries utilized in a particular application takes into consideration factors such as price, availability of a certain etch gas in a foundry, compatibilities (or incompatibilities) of the etch gas with other materials, and so forth. For instance, $SF_6$, $XF_2$, $F_2$, $CHF_3$, $CF_4$, and $C_4F_8$ are all fluorine based etch chemistries. However, each of these fluorine based etch chemistries has different safety characteristics. Furthermore, each of the fluorine based etch chemistries can fragment into other compounds, where these compounds may or may not be dangerous. For example, $F_2$ is very dangerous whereas $SF_6$ is safe to inhale. An example of a non-fluorine based etch chemistry is an oxygen ($O_2$) etch.

In terms of plasma power, some etches may involve ICP that exceeds achievable output power of a given plasma generator. An exemplary output power of a plasma generator is 2 kW. Other etches may involve a high forward power (cross-coupled power), which would preclude use of certain masking materials and certain host material-masking material systems.

Etch masking can be performed via implantation. More particularly, ion implantation can be performed through ion beams containing elements such as gallium (Ga), indium (In), gold (Au), and so forth.

Etch masking can also be performed through diffusion mechanisms, where the masking material is deposited in a host material-masking material system (e.g., Si—Ga system) and heat is applied to the system, thus causing the masking material to diffuse into and throughout the host material. To avoid undesired diffusion, temperature of the system can be controlled and/or kept within a certain range throughout the process.

Further, in the Si—Ga system, doped polysilicon growth can be used to provide etch masking. Doped polysilicon growth can occur through diffusion, ion implantation, and in situ doping. In diffusion doping, a doped silicon glass can be deposited over undoped polysilicon. The doped silicon glass will serve as a source of dopants for the polysilicon. Dopant diffusion takes place at temperatures of around 900° C. to 1000° C. and diffuses the doping into the originally undoped polysilicon. In ion implantation, dopant concentration is generally better controlled than in dopant diffusion. In in situ doping using chemical vapor deposition (CVD), dopant gases like trimethylgallium $Ga(CH_3)_3$ can be added to the CVD reactant gases to provide for the doped polysilicon during an epitaxial deposition process. Other techniques, such as atomic layer deposition and molecular beam epitaxy, can also be used to deposit the masking material.

The term "etch chemistry" refers to any etching mechanism suitable for etching (removing) the host material and not significantly etching the masking material. Chemical etching of any host material-masking material system involves breaking chemical bonds of the host material and removing resultant compound formed through interaction between the etch chemistry and the host material. The removing of the host material can be achieved through evaporation or vaporization (change from solid to gas) of the host material.

Although implantation of the masking material in the host material protects those implanted areas from etching, the implanted areas are generally not immune to the effects of etching. For the present disclosure, it is assumed that the etch chemistry is generally "orthogonal" or highly selective, terms used to describe that the etch chemistry etches the host material more rapidly than the masking material. As a particular example, gallium is not significantly etched by fluorine etches while silicon is etched by fluorine etches, thus the Si—Ga system can utilize fluorine etches with silicon as the host material and gallium as the masking material. Another example would be a tungsten-gallium (W—Ga) system, which can be etched using a fluorine etch since tungsten is etched by fluorine etches while gallium is not significantly etched.

An etch chemistry is associated with an etch gas and an etch product. The etch gas is a gas that is or contains atomic or molecular species that etch the substrate. For example, $SF_6$ can be used as an etch gas since it contains F, which etches Si by forming $SiF_4$. In this example, $SF_6$ is the etch gas and $SiF_4$ is the etch product formed from interaction between the etch gas and the substrate.

"Selectivity" of an etch chemistry is defined as a ratio between host material etch rate to masking material etch rate. An etch chemistry is generally considered to be orthogonal when the ratio is greater than 1, where higher ratios generally signify higher masking potential of the masking material. In exemplary cases, the ratio is much greater than 100. The etch chemistry is generally selected such that the implanted areas are etched at a much slower rate than the non-implanted (non-protected) areas of the host material.

However, it should be noted that what is considered "orthogonal" depends on the host and masking materials. Specifically, an "orthogonal" chemistry can be an etch chemistry with a selectivity of less than 1 in cases involving materials that are generally difficult to etch. For example, gold is difficult to plasma etch, so a much larger quantity of masking material than gold, which is the host material, is generally involved to complete etching to a given depth. In this case, an etch chemistry that is considered "orthogonal" is one with a selectivity of less than 1.

The term "passivation" refers to protection of the host material from the etching process through development of passivation layers on the host material. Generally, a passivation layer is formed along sidewalls of the host material via a passivation gas, such as $C_4F_8$ in a mixed-mode $SF_6/C_4F_8$ etch chemistry or $O_2$ in a cryogenic fluorine $SF_6/O_2$ etch chemistry, to protect the host material during the etching process.

The term "dose" refers to a per unit area measurement whereas the term "concentration" refers to a per unit volume measurement. For example, for silicon doped with gallium, the dose of the gallium atoms is given by [atoms]/area whereas the concentration of the gallium atoms is given by [atoms]/volume. Knowledge of implantation profile can allow conversion from dose to concentration, and vice versa.

For illustration and discussion purposes, the present disclosure utilizes silicon as the host material and gallium as the masking material unless otherwise stated. It should be noted that other materials can be used as the host material and the masking material. Consequently, in the discussion that follows, each mention of silicon can be replaced with other exemplary host materials and each mention of gallium can be replaced with other exemplary masking materials compatible with a particular host material.

For example, carbon can be used as the host material and gallium can be used as the masking material, thus forming a C—Ga system. As another example, indium can be utilized as the masking material for both silicon and carbon, to form Si—In and C—In systems, respectively. In yet another example, silicon can be utilized as the masking material while carbon can be utilized as the host material, thus forming a C—Si system.

Figure 13A:
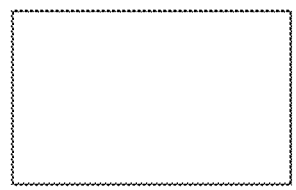
FIG. 13A shows a cross-sectional view of a host material.
Figure 13B:
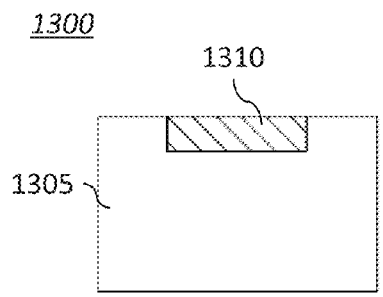
FIGS. 13B and 13C show cross-sectional views of a host material-masking material system. For discussion purposes, the system is generally considered to be a Si—Ga system.
Figure 13C:
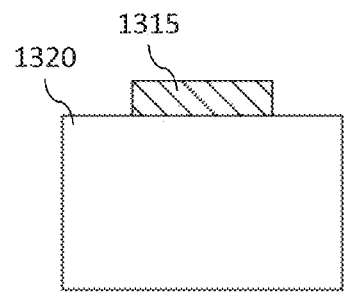

FIG. 13A shows a cross-sectional view of a host material. For the purposes of discussion, the host material is assumed to be silicon. FIG. 13B shows a cross-sectional view of a system (1300) that utilizes silicon as the host material (1305) and gallium as the masking material (1310). Specifically, the gallium (1310) is deposited in the silicon (1305). The silicon (1305) is doped with gallium (1310) through use of, for instance, ion implantation, diffusion, and/or doped polysilicon growth. FIG. 13C shows a cross-sectional view of a Si—Ga system where a layer of gallium (1315) is deposited on silicon (1320). Specifically, in FIG. 13C, the gallium (1315) does not penetrate the initial bulk of silicon (1320).

Figure 13D:
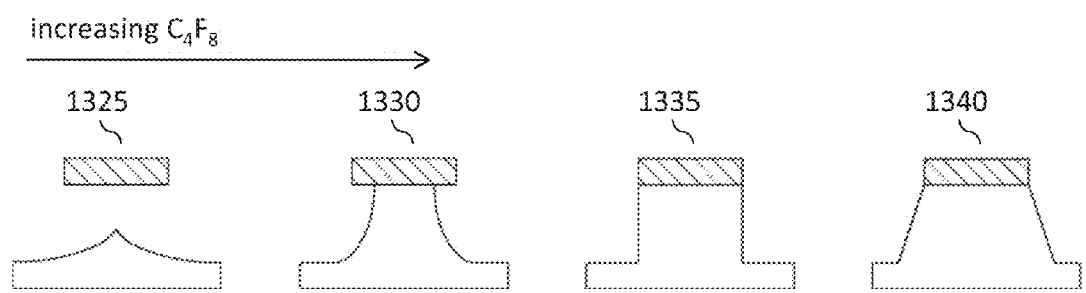
FIG. 13D shows cross-sectional views of Si—Ga systems after etching by a mixed-mode SF$_6$/C$_4$F$_8$ etch chemistry. Resulting structures are shown as a function of concentration of passivation gas C$_4$F$_8$ utilized in the mixed-mode etch.

FIG. 13D shows cross-sectional views of the Si—Ga system of FIG. 13B or FIG. 13C after etching by a mixed-mode $SF_6/C_4F_8$ etch chemistry (also referred to as a pseudo Bosch etch chemistry). Specifically, the mixed-mode $SF_6/C_4F_8$ utilizes $SF_6$ as an etch gas and $C_4F_8$ as a passivation gas. Each structure (1325, 1330, 1335, 1340) shown in FIG. 13D is formed using a common etch time but different concentrations of the passivation gas.

With reference to FIG. 13D, structure 1335 shows a structure where, for the given etch time, the concentration of the passivation gas $C_4F_8$ forms a passivation layer that protects from etching the portion of the silicon within and under the gallium. This structure (1335) can be referred to as a "vertical" structure due to there being substantially vertical sidewalls. Relative to the vertical structure (1335), structures 1325 and 1330 show under-passivated structures while structure 1340 shows an over-passivated structure.

In the under-passivated structures (1325, 1330), the concentration of the passivation gas is lower than that for the vertical structure (1335), and thus the passivation layer does not completely protect the system (1300 in FIG. 13B), more specifically the sidewalls of the system, from undercutting. As a result, the etch gas is able to remove portions of the silicon under the gallium. In the over-passivated structure (1340), the concentration of the passivation gas is higher than that for the vertical structure (1335), and the passivation layer protects the silicon even in those locations not directly below the gallium.

It should be noted that, instead of or in addition to varying the concentration of the passivation gas provided to the system (1300 in FIG. 13B), time involved in providing the passivation gas or the etch gas, the latter of which is referred to as the etch time, can be varied to provide the various structures. For instance, for a given passivation gas concentration, the structures (1325, 1330, 1335, 1340) can be formed by increasing the time involved in providing the passivation gas (and/or decreasing the time involved in providing the etch gas). Structures 1325 and 1330 can be referred to as overetched while structure 1340 can be referred to as underetched, where the over-etched structures (1325, 1330) are associated with a shorter time involved in providing the passivation gas and/or a longer time involved in providing the etch gas than the under-etched structure (1340).

"Under"-passivated and "over"-passivated are terms used relative to the "vertical" case and pertain to the protection provided to the system (1300 in FIG. 13B) through use of the passivation gas. Depending on application of the resulting structure, a structure of any one of the three categories (underpassivated, over-passivated, and vertical) can be the desired structure.

After the etching process is complete, an additional, optional step can be utilized to modify or remove the gallium (or masking material in general) from the resulting structure. The modification or removal step, also referred to as cleaning, can be used to modify or remove residual masking material, passivation material on walls (generally sidewalls) of the resulting structure, and any other materials left over from the etching process. By way of example and not of limitation, the following methods can be utilized to modify or remove the gallium:

1. Wet or dry chemical etching: Gallium can be removed by choosing an etch chemistry that etches away material comprising gallium. Alternatively, by etching all exposed material in a nonselective chemistry, material with and without gallium can be etched away at a similar rate.

2. Gallium annealing: Annealing, which is a heating process, can be used to 1) activate the gallium, causing the gallium to bond with the silicon material, and 2) cause sufficient diffusion such that gallium is below a critical concentration, where the critical concentration is determined by a minimum etch mask dosage or thickness (known as a critical dose $d_{critical}$ to be discussed later) divided by thickness of a gallium-rich region. Both the concentration and bonding state of the gallium are determinants of masking potential of the gallium material; annealing lowers or removes this masking potential. Specifically, by bonding the gallium to the silicon or diffusing the gallium throughout the silicon, masking ability of the gallium is reduced, thus resulting in a material more similar in property to silicon without an etch mask.

3. Gallium gettering or kelating: Application of a surface or substrate gettering or kelating agent would segregate the gallium from a region of interest. The surface agent can be removed after use while the substrate agent can remain in the substrate. Gettering is more often used in a vacuum processing context while kelating is more often used in a wet chemistry context. Gettering or kelating is generally used in applications where presence of gallium in the final structure would adversely affect properties of the final structure such as resistivity or mechanical strength.

4. Chemical mechanical polishing (CMP)/Physical removal: Polishing or other physical removing techniques can be used to remove the surface gallium.

A skilled person can determine whether to perform mask removal by measuring effect of keeping or removing the masking material on device performance (such as resistance and mechanical strength of the resulting device) or further processing steps (such as subsequent etching steps). The method of mask removal, if any, that yields a desired outcome would be selected. It should be noted that the processes above can be utilized to remove other masking materials from a particular host material and is not limited to removing gallium.

In an embodiment, methods and systems herein described allow determination of a minimum etch mask dosage or thickness as a function of etch depth or a maximum etch depth as a function of etch mask implantation dosage or thickness.

In an embodiment, the method comprises determining a substrate etch rate ($k_{etch}$); determining a mask erosion rate ($k_{erosion}$); determining a threshold dose ($d_{threshold}$). Determining the minimum etch mask dosage or thickness ($d_{critical}$) or the maximum etch depth ($h_{critical}$) can be performed according to the function $$h_{critical} = \frac{k_{etch}}{k_{erosion}} \times (d_{critical} - d_{threshold})$$

The equation provides a "no undercut limit" for etching, where satisfying the equation leads to a vertical structure (1335 in FIG. 13D).

Determining the substrate etch rate ($k_{etch}$), for a given etch chemistry, can be performed by etching a masked structure for a given period of time and measuring the resultant structure height, which can be performed with techniques and procedures identifiable by a skilled person. The ratio of the structure height to the etching time determines $k_{etch}$, which has units of [length]/[time], such as microns/minute.

Determining the threshold dose ($d_{threshold}$) can be performed by implanting several masks with a variety of doses and etching the implanted masks for an arbitrarily short period of time to provide etched structures using techniques and procedure identifiable by a skilled person. The threshold dose $d_{threshold}$ can be determined based on the height of the etched structure which can be detected with techniques identifiable by a skilled person. The threshold dose $d_{threshold}$ is defined as dose which fails (as defined above) for arbitrarily small etching times. Experimentally, etching for different periods of time determines an upper bound on $d_{threshold}$. As the etching time is decreased, the measured $d_{threshold}$ approaches the true value. A trend on this upper bound is thus established and the true value of can be estimated for a vanishingly small etch time as will be understood by a skilled person.

Specifically, the threshold dose $d_{threshold}$ gives a minimum density of the masking material present in the host material in order for areas of the host material with at least a dose of $d_{threshold}$ to not be significantly etched. In general, in areas and volumes of the host material where density ρ of the masking material is lower than the threshold dose $d_{threshold}$, these areas or volumes of the host material will likely be removed during the etching process.

Determining the mask erosion rate ($k_{erosion}$) for a given etch chemistry can be performed in two steps. First, an area is deposited (e.g., implanted) with a given number of atoms. This number is typically expressed as an areal density or dose, having units of [atoms]/[area], but has many equivalent expressions using different metrics including number ([atoms]), linear density ([atoms]/[length]), volumetric density ([atoms]/[volume]), and thickness ([length]). For instance, in ion implantation, the thickness refers to a dimension of a resulting structure that is parallel to an ion beam. The thickness can be measured using, for instance, inductively coupled plasma mass spectrometry (ICP-MS) or secondary ion mass spectrometry (SIMS).

Hereafter all these equivalent measures are identified as a "dose" with units of [dose]. After the area has been implanted or deposited, the sample is etched until failure of masking. Time of failure is defined as the point where the height of a structure at a given dose is less than the height of all structures that have received a higher dose. Physically, this is when the atoms remaining in the masked area are below the critical dose, which is necessary for masking capability. The ratio of the total mask dose to the time of failure determines $k_{erosion}$, which has units of [dose]/[time], such as (atoms/cm$^2$)/minute.

The mask erosion rate $k_{erosion}$ quantifies rate at which locations of the host material implanted with the masking material is removed during the etching process. A different value for $k_{erosion}$ measured for the same materials under the same etching chemistry/conditions would generally imply that the materials are also being removed by other processes. These other processes can include differential heating of the substrate, where some portions of the substrate get hotter than other portions; process variability, where conditions of the etching process are not well controlled (e.g., power, gas flows, and so forth are fluctuating unacceptably); and other causes aside from those intrinsic to the etch chemistry.

A ratio between $k_{etch}$ and $k_{erosion}$ can be used as a measure of the selectivity of a particular etch chemistry. To obtain a given desired structure, once $k_{erosion}$ is known for a particular masking material (for a given etch chemistry), a skilled person in the art would be able to compensate for the effects of $k_{erosion}$ by defining a structure, using the masking material, slightly different in size and/or shape of the desired structure. Once etching has been performed on the defined structure, portions of the masking material would have been etched along with portions of the host material in such a manner so as to obtain the desired structure.

The ratio between $k_{etch}$ and $k_{erosion}$ for a certain etch chemistry is indicative of the orthogonality of the etch chemistry with reference to the substrate material and mask material of choice.

The wording "orthogonal" as used herein with reference to an etch chemistry in connection with a substrate material and an etch mask indicates the ability of the etch chemistry to selectively etch the substrate material over the mask material. Accordingly, the term orthogonal is related to the term "selectivity". Selectivity for a mask is the ratio of the depth of the etched material (substrate) to the depth of the masking material (e.g., photoresist or implanted gallium). In particular, in the sense of the present disclosure, a chemistry is orthogonal to an etch mask or mask material and a substrate material if the ratio of the substrate material etch rate to the mask material etch rate is greater than 1 (e.g., 2). In exemplary cases illustrated herein, this ratio is typically >>100, and can be increased and decreased by changing the etching conditions according to the experimental design of choice. While any ratio >1 is associated with masking potential, the utility of this technique generally increases with higher ratios.

Accordingly, in an embodiment, a method and system are described for fabricating structures in a substrate material, that are based on use of an etch mask in connection with an orthogonal etch chemistry. In an embodiment, a substrate material and etch masking material are selected so that the ratio between $k_{etch}$ and $k_{erosion}$ for a certain etch chemistry depends on the particular application and/or structure and can occur with a ratio of, for example, 1:2, 1:4, 1:5, 1:10, and lower. Parameters involved comprise the particular application, the substrate material, the mask material, the etch chemistry, and a structure height, which are selected according to a certain experimental design.

In an embodiment, etch masking can be performed via implantation and in particular via ion implantation. More particularly, implantation can be performed through ion beams such as gallium (Ga), indium (In), gold (Au) ion beams and ion beams of additional elements identifiable by a skilled person. In an embodiment, the etching can be performed by fluorinated etch chemistry. In an embodiment, etching can be performed by a suitable dry etch chemistry orthogonal to the substrate material and the etch mask.

An exemplary etch mask that can be used in connection to various orthogonal etch chemistries is provided by Ga+ mask. One of the first observations of high selectivity Ga masking is in preferential wet etching of the silicon over Ga-doped silicon [see reference 15]. However, not only is Ga+ mask resilient against wet chemical etching, it is also effective for masking fluorinated reactive ion etching [see reference 16]. Further demonstrations of Ga-based masking in plasma etching showed that deep reactive ion etching (DRIE) with time-multiplexed etch chemistries can produce micron scale features with nanometer scale etch depths [see reference 14]. According to a further approach a cryogenic $SF_6/O_2$ silicon etch was used with an implanted Ga mask [see reference 3]. In particular, according to this further approach the mixed-mode cryogenic silicon etch dramatically reduced the mechanical milling aspect, which is proportional to the bias voltage, with an increase in chemical etching thereby increasing the etch mask selectivity [see reference 4].

The Ga+ mask can be used with any substrate material which is etched in fluorine or oxygen. Exemplary substrate material that can be used with a Ga+ etch mask comprise group IV elements of the periodic table and their compounds, particularly those with C, Si, and/or Ge. Exemplary substrate material comprising group IV elements comprise silicon, silicon carbide, silica, silicon nitride, SiGe, germanium, amorphous carbon, graphite, diamond, carbon nanotubes, organic compounds, electron beam and photoresists, PDMS, and other metals such as tungsten.

In an embodiment, the method a dry etch chemistry which relies on the high preferential etching of silicon or other material in group IV over that of gallium (Ga).

In some embodiments, the Ga+ masking techniques can be used together with Inductively Coupled Plasma Reactive Ion Etching (ICP-RIE) processes orthogonal with respect to the Ga+ mask and the substrate material of choice. In particular, the ICP-RIE can be suitably modified to retain the anisotropic patterning while preserving the Ga masking capability according to techniques identifiable by a skilled person upon reading of the present disclosure.

In some embodiments, the Ga+ masking techniques can be used together with the $SF_6/C_4F_8$ and/or $SF_6/O_2$ cryogenic etch chemistry as illustrated in more detail in the present disclosure.

Additional orthogonal patterning/etching chemistries comprise etch chemistries that contain different reactive anions, such as halogens (fluoride, chloride, bromide, iodide) and other anions (hydride, sulfide, carbonate, hydroxide, nitrate, phosphate, sulfate, acetate, formate, oxalate, and cyanide). These etch chemistries are to be used at appropriate etching temperatures and pressures such that the resultant gallium-containing compounds are etched at a rate much lower than the resultant substrate compounds as will be understood by a skilled person. A skilled person will also be able to identify the applicable chemistry for a certain substrate material and mask material upon reading of the present disclosure.

Additional etch masks comprise any masking material able to form a compound not significantly etched by the etching chemistry of choice relative to the substrate material of choice. Elements in Group III of the periodic table, such as gallium, boron, aluminum and indium, share a similar valence structure and thus can form these compounds.

In an embodiment, methods and systems herein described do not require a planar surface for effective spin coating and exposure, and can be used to pattern/etch non-planar structures. Additionally the linear relationship of etch depth to dose beyond the threshold dose allow fabrication of three-dimensional structures in the substrate material using multi-exposure and grayscale etch masking.

A further description of the methods and systems of the present disclosure is provided with reference to applications wherein the masking is provided by Ga+ ion implantation in connection with various etching techniques. A person skilled in the art will appreciate the applicability of the features described in detail for Ga+ silicon material for other patterning techniques and suitable material.

In some of those embodiments, silicon etch masks are patterned via Ga+ ion implantation in a focused ion beam (FIB). In particular, FIB implantation of gallium (Ga) into silicon can be used to define nanoscale structures directly without resist at any stage of the fabrication, achieving both high throughput and high aspect ratio structures. Additional suitable patterning techniques comprise thermal diffusion of Ga into a material using a patterned diffusion barrier, thermal diffusion of Ga into a material using a patternable doped spin-on-glass containing gallium, direct printing of a Ga ink or eutectic, source material grown with a gallium layer already present, which can then be patterned in an arbitrary method, implantation using ion projection lithography, implantation into a deposited sacrificial layer that can be removed after etching, and additional techniques identifiable by a skilled person.

In some of those embodiments, silicon etch masks are patterned via Ga+ ion implantation in FIB and then anisotropic etched in an ICP-RIE using fluorinated etch chemistries. According to some embodiments, the critical areal density of the implanted Ga layer in silicon required to achieve a desired etch depth for both a combined $SF_6/C_4F_8$ etch chemistry ($SF_6/C_4F_8$) or cryogenic fluorine ($SF_6/O_2$) silicon etch is determined. Examples of high fidelity nanoscale structures down to 30 nm and high aspect ratio structures of 17:1 are shown. Since etch masks can be patterned on uneven surfaces, this lithography can be utilized to create multilayer structures in silicon. The linear selectivity versus implanted Ga density enables grayscale lithography.

In accordance with embodiments of the present disclosure, different etching regimes for pattern transfer of FIB implanted Ga+ masks in silicon are described. Due to properties of the etching plasma, there is a tradeoff between selectivity and anisotropy.

The selectivity indicates the ratio of the etch rate of material to the etch rate of the mask. As an example, if a 1-micron thickness of a masking material (such as photoresist) is removed during a process that etches 10-microns thickness of substrate material, the selectivity is 10:1. Higher selectivity is desirable. Generally, there is a tradeoff between pattern resolution (higher for thinner masks) and maximum etch depth (higher for thicker masks). High selectivity masks enable etching of structures that have a small minimum feature size while still allowing deeply etched structures.

The wording "anisotropy" as used herein indicates the ability of an etching material to etch in a single direction vice all directions. Accordingly, an anisotropic etch is in contrast to an isotropic etch, which etches in all directions at the same rate. An example of an isotropic etch is the removal of silica by hydrofluoric acid. In particular, an anisotropic etch typically inhibits etching in other directions by using surface passivation, inhibitor deposition, crystalline anisotropic, or some combination of these or other techniques.

According to embodiments of the present disclosure, by operating at different points of the tradeoff between selectivity and anisotropy, it is possible to develop etch conditions appropriate for different applications.

For example in some embodiments, wherein minimum feature size etching is desired, a mixed-mode $SF_6/C_4F_8$ plasma can be employed that has moderate selectivity and high anisotropy and describe feature size and etch depth dependence on implantation dose. This approach is also referred to in the present description as combined $SF_6/C_4F_8$ etch chemistry, an etching technique identifiable by a skilled person and described for example in [reference 8] herein incorporated by reference in its entirety.

In embodiments wherein a higher aspect ratio structures at the expense of mask notching and lower anisotropy is desired, a cryogenic $SF_6/O_2$ plasma can be used, an etching technique identifiable by a skilled person and described for example in [see reference 4] [reference 8] herein incorporated by reference in its entirety.

In embodiments, wherein maximum selectivity and complete isotropy is desired, a cryogenic $SF_6$ plasma appropriate for release of Ga implantation defined membrane.

In some embodiments, masking/etching can be extended over the undercut-limited regime of the cryogenic etch by controlling the selectivity to anisotropy tradeoff.

Although resist patterning is typically limited to planar surfaces, the Ga deposition technique of the present disclosure can be used to provide a Ga mask writing, patterns implanted on non-planar silicon structures for multilayer etching and grayscale lithography.

In an embodiment, where the methods and systems herein described are applied to nanometer scale structures, complete passivation and etch features result in low undercutting. Also in an embodiment, the high pattern fidelity of the nanoscale structures allows establishing a realistic minimum feature size figure of merit.

In accordance with an exemplary embodiment, patterning of the Ga etch mask can be performed using the dual beam Nova FIB/SEM by FEI. A cleaned silicon sample is placed at the eucentric height and rotated such that the Ga+ ion beam strikes perpendicular to the substrate surface. For a selected beam current, the $Ga^+$ beam is focused at the edge of the substrate. Automated write programs specifying the pattern and dwell times are then executed to raster the ion beam. In particular, the write programs control the blanking of the beam and the movement of the beam. In a manner analogous to a scanning electron microscope, the FIB accelerates the $Ga^+$ ions to the surface of the silicon substrate using various accelerating beam voltages according to techniques known as such to the person skilled in the art. The magnitude of the beam voltage controls both the implantation depth and the thickness of the Ga layer.

In particular, to estimate the effect of the beam voltage on the thickness of the implantation layer and implantation depth, simulations using Stopping and Range of Ions in Matter (SRIM/TRIM®) were performed for implanting $Ga^+$ ions into silicon [see reference 22]. The results are summarized in FIG. 1, where the vertical straggle length of the implantation is taken to approximate the thickness of the Ga-implanted layer for the purpose of effective selectivity calculations. For the implantation for patterning performed in the examples of the present disclosure, Applicants used an exemplary 30 kV beam voltage. From the implantation simulations of 30 kV beams, the implantation damage is approximated to the top 15 nm of silicon, creating amorphous silicon, and the next 20 nm below as a Ga rich amorphous silicon layer, consistent with TEM measurements [see reference 10].

To investigate patterning over the entire nanometer length scale, three sets of patterns were generated. To measure the nanometer range, Applicants patterned squares starting at 500 nm and ending at 50 nm stepped in 50 nm increments. The dose columns began at $5.3 \times 10^{15}$ cm$^{-2}$ and ended at $1.96 \times 10^{17}$ cm$^{-2}$ with the dose stepped in approximately $1 \times 10^{16}$ cm$^{-2}$ increments. To determine sub 200 nm resolution, Applicants again patterned squares starting at 200 nm and ending at 20 nm stepped in 20 nm increments. The third pattern arrays were circles starting at 100 nm in diameter and ending at 10 nm in diameter stepped in 10 nm increments. Both in the second and third pattern arrays, the dose column began with $1.25 \times 10^{16}$ cm$^{-2}$ and ended in $1.25 \times 10^{17}$ cm$^{-2}$ with the dose stepped in approximately $1.25 \times 10^{16}$ cm$^{-2}$ increments using a measured 6.87 pA beam.

Figure 2:
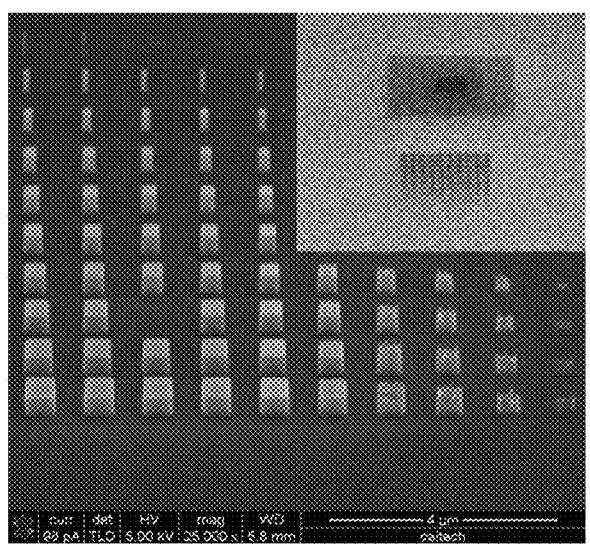
FIG. 2 shows an exemplary scanning electron micrograph (SEM) of a dose array for a nanoscale mixed-mode $SF_6/C_4F_8$ etch according to an embodiment herein described. In the example of FIG. 2, etch depth was 460 nm with the squares ranging from 500 nm down to 50 nm in 50 nm increments. The inset of FIG. 2 is an SEM of a Ga implanted nanoscale dose array in silicon. The large square was where the ion beam was focused and used as a visual marker.
Figure 14A:
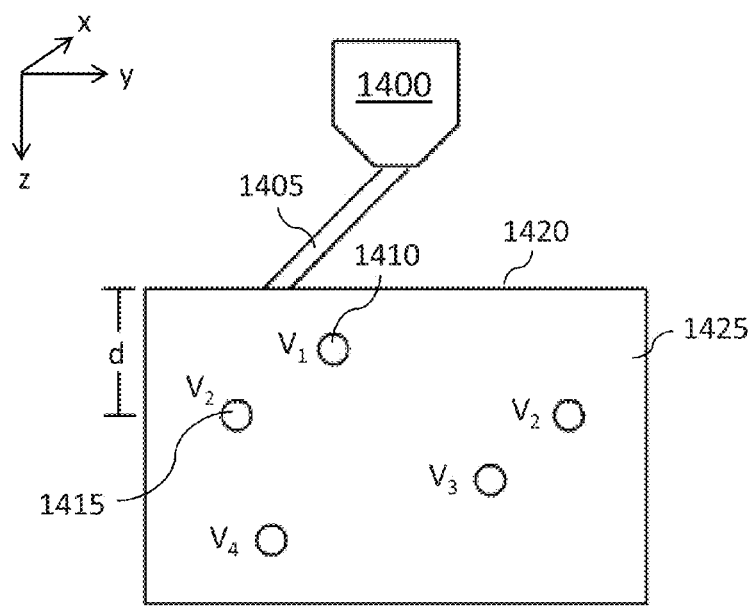
FIG. 14A illustrates a system for implantation of masking material into host material. Implantation depth is shown as a function of voltage.

For the micron scaled structures, Applicants created dose arrays of 5 micron-by-5 micron squares separated by approximately 10 microns. Each square dose was varied by incrementing the write time by 2 seconds. With the beam current at 100 pA, this provided a dose step of $5 \times 10^{16}$ cm$^{-2}$. The dose array began at $1 \times 10^{16}$ cm$^{-2}$ and stopped at $5 \times 10^{16}$ cm$^2$. After implantation, verification of the patterning can be seen using a scanning electron microscope (SEM). The inset of FIG. 2 shows an SEM of the dose array for the micron scale features. In particular, the dose array is the graphical representation used herein to show the dependence on achievable masked etch depth on the implanted areal dose FIG. 14A illustrates ion implantation of the masking material into the host material. The exemplary case of a Si—Ga system is considered. From a gallium ion source (1400), a gallium ion beam (1405) can be steered across a silicon surface (1420). To define particular locations (1410, 1415) within the silicon (1425) at which to implant the gallium, input voltage of the ion beam (1405) can be varied. It should be noted that the ion beam (1405) can be characterized by an input voltage, an input power, or an input energy. Input voltage, power, and energy are directly proportional in value to each other. For simplicity in the present disclosure, the input voltage is utilized to characterize the ion beam unless otherwise specified.

As shown in FIG. 14A, a depth d is defined as distance from the silicon surface (1420) to an average resting place of any particular gallium ion (1410, 1415). In general, higher input voltage leads to a deeper implantation of the gallium. Specifically, in FIG. 14A, $V_1 < V_2 < V_3 < V_4$. Depending on desired depth of implantation, the input voltage can be adjusted accordingly. The use of the term "average resting place" is more clearly illustrated with reference to FIG. 14B.

Figure 14B:
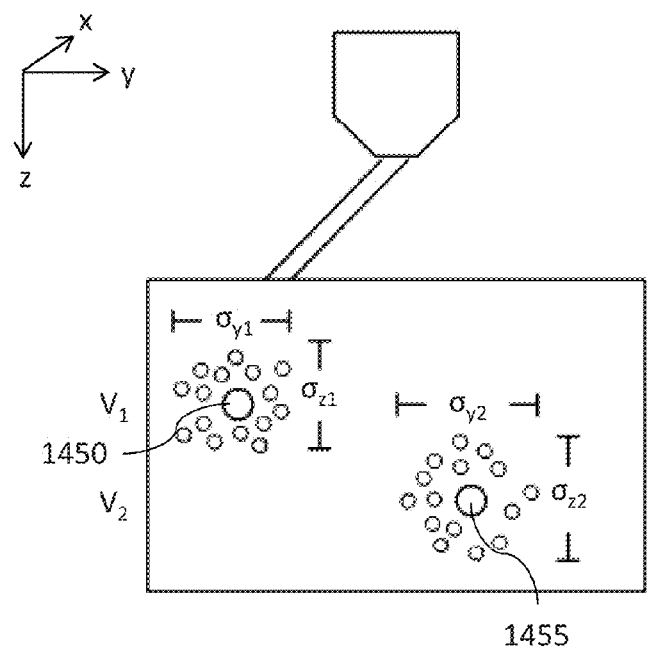
FIG. 14B shows distribution (spread) of resting places of ions implanted into the host material.

FIG. 14B illustrates actual resting place of any particular gallium ion. At a first input voltage $V_1$, an average resting place of any particular gallium ion is at location 1450. At a second input voltage $V_2$ (where $V_2 > V_1$), an average resting place of any particular ion is at location 1455. However, interaction between the gallium ions and the silicon atoms within the silicon material (1425 in FIG. 14A) is rarely completely predictable. For instance, a non-uniform distribution of silicon atoms within the silicon material (1425 in FIG. 14A), a random path followed by any particular gallium ion, finite size of ions and atoms, and so forth can all yield a distribution of possible locations where any particular gallium ion may rest.

The "average resting place" (1450, 1455) is thus used to denote a location, where, for a given set of conditions, an ion is probable to rest. The average resting place can be determined by simulating a large number of individual gallium implantation events and computing the average resting place by adding coordinates of resting places of all the simulated events and dividing the sum by the number of simulated events.

Specifically, FIG. 14B shows that an average resting place of a first ion (1450) associated with an input voltage $V_1$ and of a second ion (1455) associated with an input voltage $V_2$ has a distribution of locations around which any particular gallium ion can possibly rest. For the first ion (1450), spread of the distribution is quantified by a spread $\sigma_{y1}$ along the horizontal axis in FIG. 14B and a spread $\sigma_{z1}$ along the vertical axis in FIG. 14B. Although not shown in FIG. 14B, there is also a distribution $\sigma_{x1}$ of gallium ions along an x axis that is perpendicular to the vertical axis. Similarly, for the second ion (1455), spread is quantified by $\sigma_{y2}$ and $\sigma_{z2}$ (and $\sigma_2$). It should be noted that the designations of x, y, and z are arbitrary.

Table 1 shows calculations/simulations performed at different input energies for implantation depth d and spreads $\sigma_y$ and $\sigma_z$. These calculations/simulations are performed using Stopping and Range of Ions in Matter (SRIM®) 2010. Additionally, calculations are performed to obtain ratios between the depth and the spread.

TABLE 1

Depth and spread as a function of input energy

| E (keV) | d (Å) | $\sigma_z$ (Å) | $\sigma_y$ (Å) | $d/\sigma_z$ | $d/\sigma_y$ |
| --- | --- | --- | --- | --- | --- |
| 0.064 | 10 | 5 | 4 | 2 | 2.5 |
| 2.25 | 52 | 23 | 17 | 2.26 | 3.05 |
| 7.00 | 100 | 40 | 30 | 2.5 | 3.33 |
| 27.50 | 250 | 88 | 68 | 2.84 | 3.67 |
| 65.00 | 497 | 159 | 122 | 3.12 | 4.07 |
| 150.00 | 1047 | 303 | 230 | 3.45 | 4.55 |
| 800.00 | 5486 | 1138 | 961 | 4.82 | 5.71 |

As shown in Table 1 and illustrated in FIG. 14B, spread ($\sigma_z$, $\sigma_y$) increases as input energy increases. This generally results from more scattering events between the gallium ions and the silicon atoms due to longer distances traveled by the gallium ions through the silicon material at higher input energies. The increase in scattering events can be observed from the larger spread exhibited by the gallium ions.

Consequently, resolution of the implantation of gallium, and thus resolution of a structure capable of being patterned in the Si—Ga system, can be limited by input energy used in the implantation of gallium. From the data in Table 1, resolvable features of a desired structure can only be a few times smaller (around 2-5 times) than the depth of the ion implantation due to the spread of the ions.

In accordance with an embodiment, etching of a Ga+ mask can be performed by combined $SF_6/C_4F_8$ etch chemistry. In particular, in an exemplary embodiment, patterned Ga implanted silicon samples were anisotropically etched in an Oxford Instruments PlasmaLab 100 inductively coupled plasma reactive ion etcher (ICP-RIE) 380. The Si samples, N-doped <100>rho=1-10 ohm-cm and P-doped <100>rho=0.005 ohm-cm, were placed on a 6 inch silicon carrier wafer using Fomblin oil as an adhesive and thermal conductor. The etch chemistry utilized was a mixed-mode etch using $SF_6$ as the etch gas and $C_4F_8$ as the passivation gas simultaneously injected, combined $SF_6/C_4F_8$ etch chemistry silicon etch [see reference 8]. The first dose array etch was perform under the following conditions: ICP power of 1200 W, Fwd power of 10 W, table temperature of 15° C., chamber pressure of 10 mTorr, $SF_6/C_4F_8$ gas flow of 33 sccm/50 sccm, and a measured forward bias of 54 volts. The second and third dose arrays were etched under identical etching conditions as before, except Fwd power was increased to 15 W and the $C_4F_8$ gas was increased to 68 sccm; this modification improved pattern fidelity for sub 100 nm structures. Upon completion of etching, the Fomblin was removed using Isopropanol Alcohol (IPA) and the sample imaged using either the FEI Nova 600 or a FEI Sirion SEM, as shown in FIG. 2.

In particular, FIG. 2 shows a scanning electron micrograph of a dose array for nanoscale $SF_6/C_4F_8$ etch. Etch depth was 460 nm with the squares ranging from 500 nm down to 50 nm in 50 nm increments. As already mentioned above, the inset of FIG. 2 is a SEM of a Ga-implanted nanoscale dose array in silicon. The large square was where the ion beam was focused and used as a visual marker.

Dose arrays of 50 nm to 500 nm squares were etched for different times so that etch rate, minimum dose for a required depth, the critical dose, and minimum structure size could be ascertained. Samples were inspected in SEM to determine the time and height of each structure. A dose array typically allows a structure at the described etch depth for most any size and it is key to making said structures as it would be understandable by a skilled person upon reading of the present disclosure.

Figure 3:
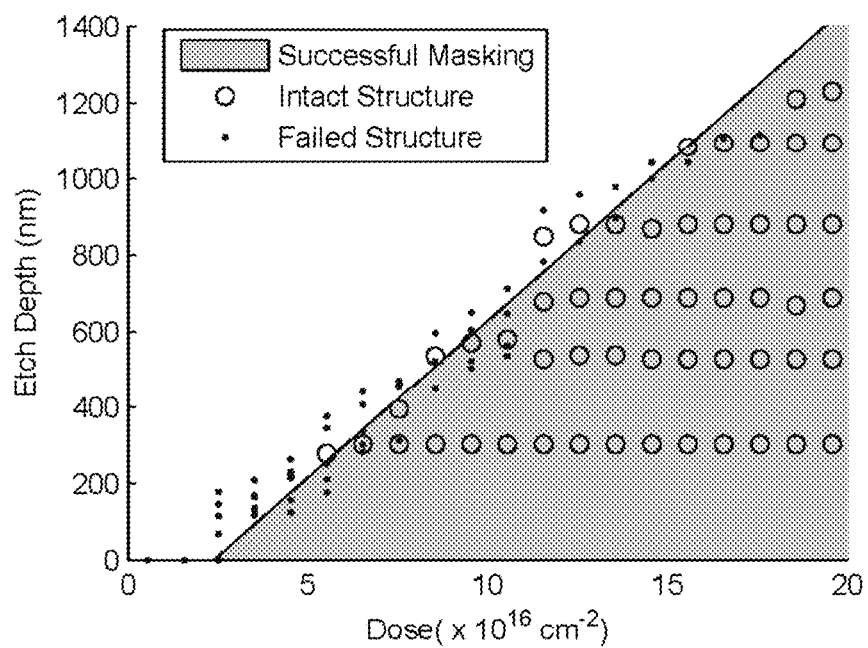
FIG. 3 shows an exemplary Ga dose array (the dose required for a given etch depth or selectivity) for the combined $SF_6/C_4F_8$ etch chemistry silicon etch according to an embodiment herein described. Each horizontal line represents a given etch time, and the diagonal describes the minimum dose required for achieving a desired etch depth.

The results of these measurements are shown in FIG. 3, which shows the Ga dose array (the dose required for a given etch depth or selectivity) for the Combined $SF_6/C_4F_8$ etch chemistry silicon etch. Each horizontal line represents a given etch time, and the diagonal describes the minimum dose required for achieving a desired etch depth. Two features of this graph should be noticed. First, no measurable masking occurs below a particular dose, termed in the present disclosure as the threshold dose $d_{threshold}$. Next, the height of failure displays an approximately linear relationship with the areal dose.

Motivated by this apparent structure, Applicants fitted the data with the following equation:

$$h_{critical} = \frac{k_{etch}}{k_{erosion}} \times (d_{critical} - d_{threshold}) \quad (1)$$

where $h_{critical}$ is the height of the etched structure at failure, $k_{etch}$ is the experimentally measured etch rate, $d_{critical}$ is the measured dose from FIB implantation of the failed structure, and $k_{erosion}$ and $d_{threshold}$ are the effective erosion rate of the mask and the threshold dose treated as free parameters to be determined by a least squares fit to the data. The etch rate, $k_{etch}$ was determined to be 186 nm/min for the P-doped silicon samples. For the combined $SF_6/C_4F_8$ etch chemistry data, the fit yields the following fit parameters:

$$h_{critical} = \frac{0.186\left[\frac{\mu m}{min}\right]}{2.45 \times 10^{16}\left[\frac{ions \cdot cm^{-2}}{min}\right]} \times (d_{critical} - 1.85 \times 10^{16}[ions \cdot cm^{-2}]) \quad (2)$$

Figure 4:
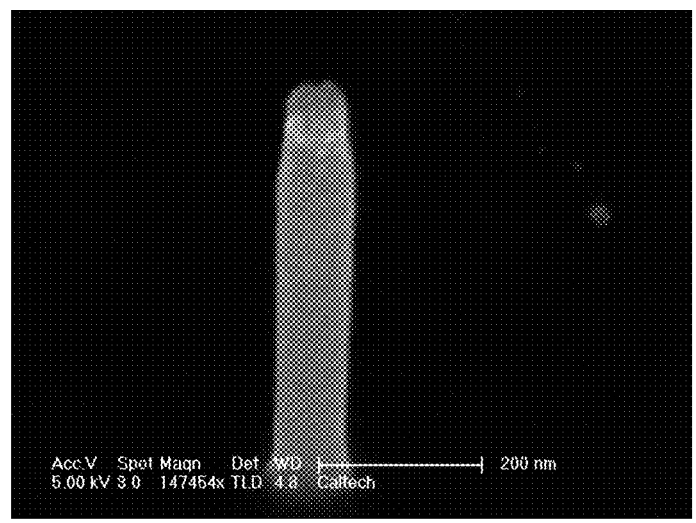
FIG. 4 shows an exemplary SEM of a silicon nanopillar 72 nm in diameter and 800 nm tall according to an embodiment herein described.

Since the implantation thickness was approximated as 20 nm, the selectivity of mask improves as the areal dose increases (increasing the density of the Ga mask) and is also described using equation (1) by dividing the etch height by the mask thickness of 20 nm. Although the etch damage is approximated to be the 15 nm of amorphous silicon on the top of the etch mask, Applicants note that surface remains notably smooth. The first dose array demonstrates that the masking technique in accordance with the present disclosure can create, at the minimum write pattern of 50 nm, a 72 nm diameter nanopillars and 800 nm tall with sidewall and roughness of less than 5 nm, as shown in FIG. 4.

Although the patterned size was originally 50 nm, the increase in size to 72 nm is consistent with SEM resolution and SRIM calculations of having a lateral straggle length of 7.2 nm. Other contributions to the mask size increase can be attributed to several factors including approximation of the beam as Gaussian and the ion beam being slightly defocused. Applicants approximate the lateral straggle as being the most significant of all the contributions at this beam voltage. Resolution and characterization of the Ga beam width will be discussed later in the present application [see references 1, 7, 12, 20].

To investigate the minimum structure size, Applicants employed the second and third dose array for the nanoscale $SF_6/C_4F_8$ etch.

Figure 5:
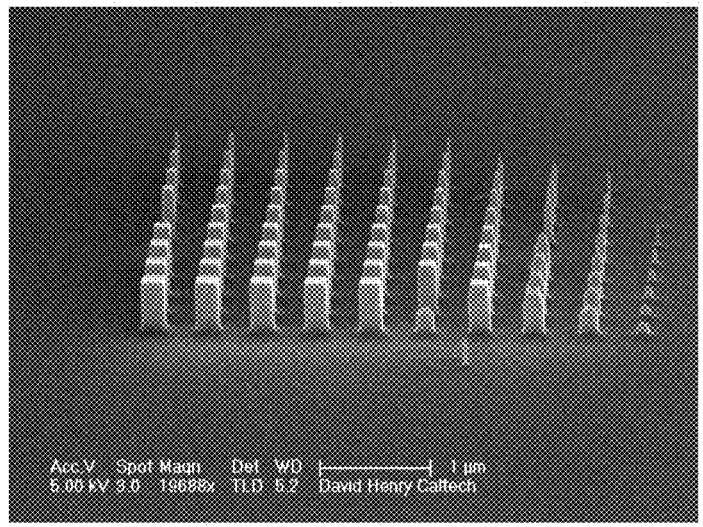
FIG. 5 shows an exemplary SEM of a second dose array for the nanoscale $SF_6/C_4F_8$ etch according to an embodiment herein described. In the example of FIG. 5, etch depth was 448 nm with the squares ranging from 200 nm down to 20 nm in 20 nm increments.

In accordance with an embodiment of the disclosure, the second dose array consisted of squares etched 448 nm tall, shown in FIG. 5. The minimum pattern etched was a 43 nm square with an aspect ratio of 10:1. Although a 20 nm square was implanted, the SEM shows only a mound where the pattern began to etch but ultimately failed, possibly due to a lower $Ga^+$ concentration cause by imperfect focusing. It is also clear that the minimum dose of $1.25 \times 10^{16}$ $cm^{-2}$ was not sufficient to protect the silicon much greater than 70 nm.

Figure 6:
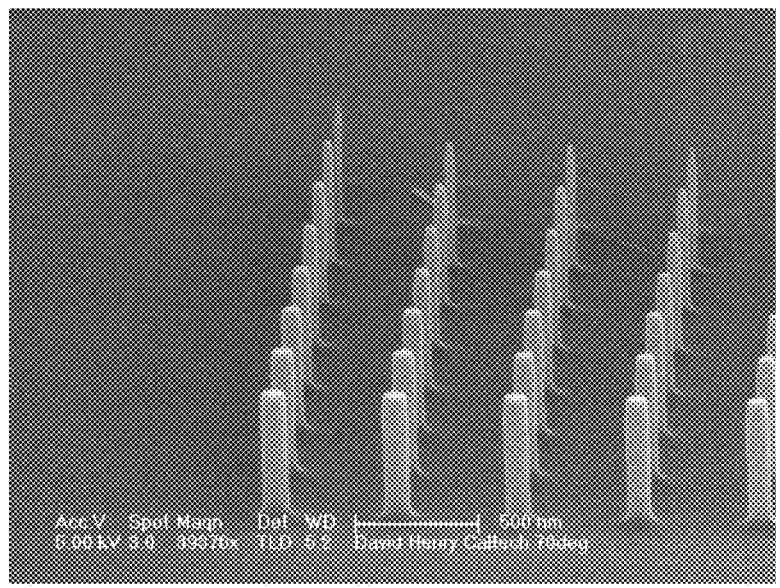
FIG. 6 shows an SEM of a third dose array for the nanoscale $SF_6/C_4F_8$ etch. In the example of FIG. 6, etch depth was 448 nm with the pillars ranging from 100 nm down to 10 nm diameters in 10 nm increments.

The third dose array patterns were circles for vertical silicon nanowire fabrication and were etched simultaneously with the second dose array pattern. The minimum pattern etched was the 31 nm diameter pillar, as shown in FIG. 6. The etch was reentrant at 89.15 degrees, causing the base of the pillar to be at an 18 nm diameter. Although it is clear that some masking occurred for the 20 nm pattern, the reentrant angle did not permit the structure to withstand the etch. Important to note is the higher fidelity of this patterning as compared to previous demonstrations.

This etch attained a very high selectivity with no oxygen in the etch chemistry. This is contrary to the masking mechanism of $GaO_x$ forming at the surface proposed elsewhere [see reference 16]. Formation of a $GaO_x$ layer during sample exposure to ambient is also excluded due to the 28 nm implantation depth. This leads us to hypothesize another masking mechanism. Fluorine can bond with the Ga to create an involatile $GaF_x$ mask, which can also contribute to further physical sputtering resistance. This is consistent with previous results using reactive ion etching with $SF_6$ which relies on $F^+$ ions for etching [see references 3, 14, 16].

In an embodiment, etching of silicon masked with Ga+ can be performed by cryogenic silicon etching. In particular, using the same etching system and mounting techniques as the nanoscale etch, micron sized features were also etched to determine the etch rate and threshold dose for a required depth. The etch chemistry employed for this scale was a mixed mode cryogenic silicon etch. This etch uses $SF_6$ as the etchant gas but relies on $O_2$ to create a sidewall passivation layer of $SiO_xF_y$. This molecule is formed when the substrate temperature is below -85 C. Details of the sidewall passivation and etch process is detailed elsewhere and is not discussed here [see references 4, 9]. The etch conditions used are as follows: ICP power of 900 W, Fwd power of 10 W, table temperature of -130° C., chamber pressure of 10 mTorr, $SF_6/C_4F_8$ gas flow of 70/6.5 sccm, and a forward bias of 54 volts.

Figure 7:
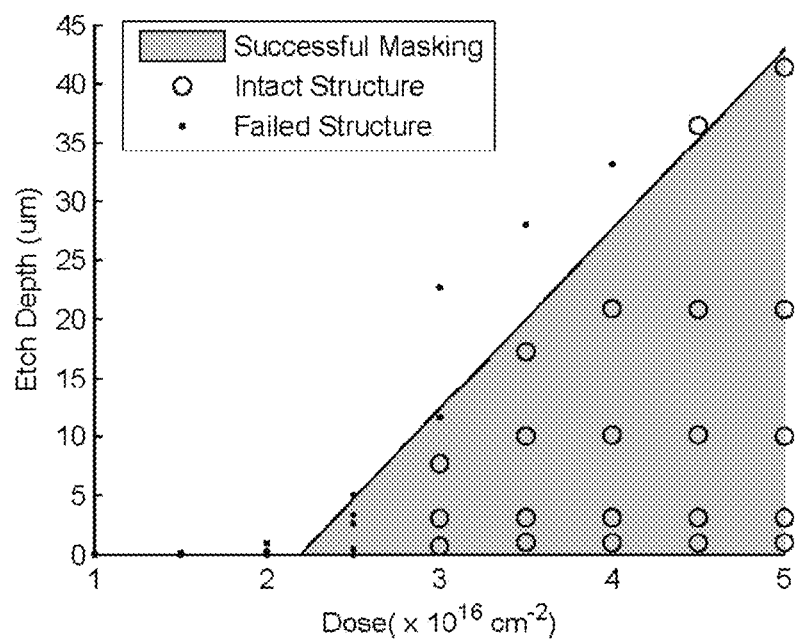
FIG. 7 shows an exemplary Ga dose array (the dose required for a given depth or selectivity) for a cryogenic silicon etch according to an embodiment herein described. Each horizontal line represents a given etch time, and the diagonal describes the minimum dose required for achieving a desired etch depth.

Threshold dose and selectivity for the dose array illustrated in FIG. 3 were determined. In particular, the cryogenic dose array described above in connection with FIG. 3, was etched for etch times of 1, 3, 10, 20 and 40 minutes with a measured etch rate, $k_{etch}$, of 1.03 μm/min; the results are detailed in FIG. 7. Each horizontal line represents a given etch time, and the diagonal describes the minimum dose required for achieving a desired etch depth. The etch depth dependence on dose for the cryogenic etch was least squares fit and is described by equation (2).

The Fwd power, and subsequently the bias voltage, was intentionally set to match that of the combined $SF_6/C_4F_8$ etch chemistry etch with the other etching parameters set to optimize the etch. Although the ICP and gas chemistry changes the plasma density, matching the bias voltages allows for the milling aspect of the two etch chemistries to be more closely compared.

$$h_{critical} = \frac{1.03\left[\frac{\mu m}{min}\right]}{0.06736 \times 10^{16}\left[\frac{ions \cdot cm^{-2}}{min}\right]} \times (d_{critical} - 2.2 \times 10^{16}[ions \cdot cm^{-2}]) \quad (3)$$

Interestingly, $d_{threshold}$ is nearly the same for both etch chemistries ($2.2 \times 10^{16}$ ions*$cm^{-2}$ as compared to $1.85 \times 10^{16}$ ions*$cm^{-2}$), while $k_{erosion}$ for the cryogenic etch is nearly two orders of magnitude lower than for combined $SF_6/C_4F_8$ etch chemistry. This threshold dose, etched with 10 W of Fwd power, is consistent to that reported by Chekurov et al. who etched with 2-3 W of Fwd power and with an etch rate approximately double of that reported here [see reference 3]. To compare the fidelity of the combined $SF_6/C_4F_8$ etch chemistry etch to that of the cryogenic, a smaller feature size combined $SF_6/C_4F_8$ etch chemistry dose array pattern was cryogenically etched for 1 minute (approximately 1 micron). The minimum resolvable feature was a 350 nm square mask with the pillar body 200 nm at its widest spot, as shown in FIG. 8.

Figure 8:
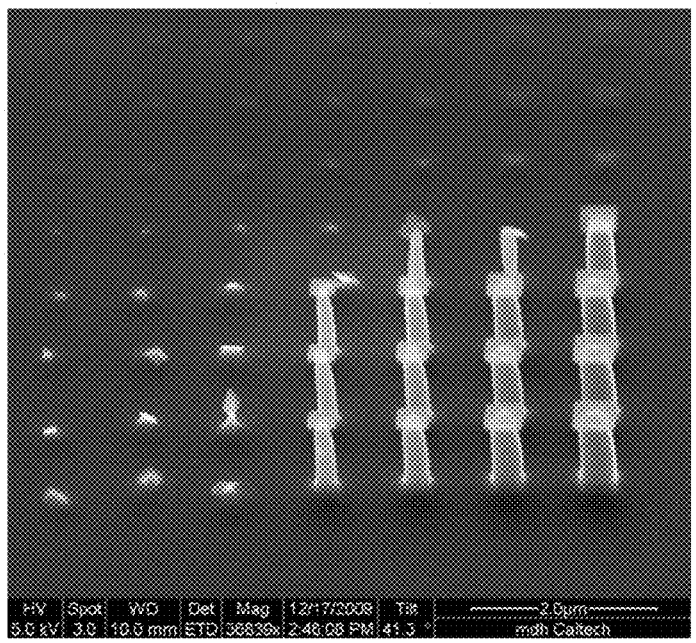
FIG. 8 shows an exemplary SEM of Ga-masked silicon squares, cryogenically etched 1 micron tall, to quantify mask undercut associated with cryogenic etching according to an embodiment herein described. In the example of FIG. 8, the pattern etched is substantially identical to that used for the combined SF6/C4F8 etch chemistry dose array of FIG. 2 taking into account defocusing and other processes that were modeled as in FIG. 1.
Figure 9:
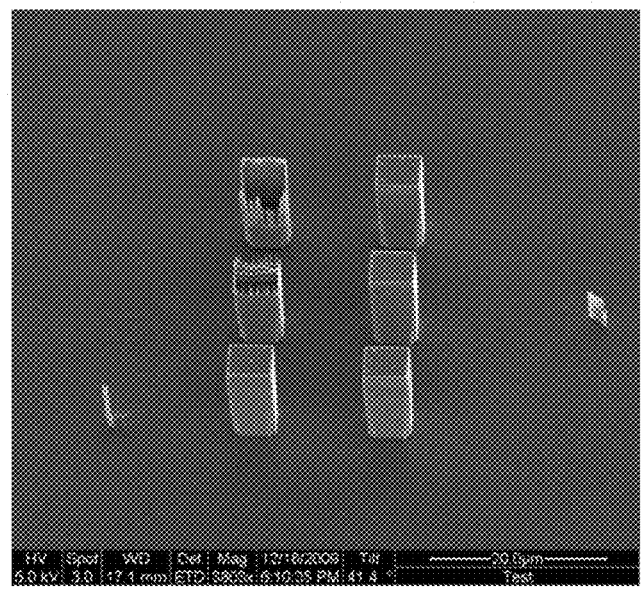
FIG. 9 shows an exemplary SEM of a dose array for the cryogenic etch according to an embodiment herein described. In the example of FIG. 9, etch depth was 10.1 µm with 5 µm squares. The dose was varied in this array from $1 \times 10^{16}$ cm$^{-2}$ to $5 \times 10^{16}$ cm$^{-2}$ in $0.5 \times 10^{16}$ cm$^{-2}$ increments.

In particular, FIG. 8 shows an SEM of Ga-masked silicon squares, cryogenically etched 1 micron tall, to quantify the mask undercut associated with cryogenic etching. The pattern etched is identical to that used for the combined $SF_6/C_4F_8$ etch chemistry dose array taking into account slight experimental variations. In particular, the dimensions are slightly different that those defined in the patterning file, due to defocusing and other processes modeled as in FIG. 1. In particular the same conditions for defining the mask in FIGS. 2 and 8, were used but the etches were different, which is what causes the difference in outcomes. Thus, taking those into account, the pattern is exactly as predicted with (importantly) little to no undercut FIG. 9 shows a SEM of a dose array the cryogenic etch. Etch depth was 10.1 μm with 5 μm squares. The dose was varied in this array from $1\times10^{16}$ cm$^{-2}$ to $5\times10^{16}$ cm$^{-2}$ in $0.5\times10^{16}$ cm$^{-2}$ increments.

Sensitivity of threshold dose to ion implantation depth was then determined. In particular, to investigate if the FIB beam accelerating voltage affected the threshold dose, a 6 by 4 array of Ga implanted 5 μm by 10 μm rectangles was patterned. The beam voltages sampled were 5, 10, 20, and 30 kV written with beam currents of 120 pA, 50 pA, 81 pA, and 100 pA, respectively. Beam currents were selected to match implantation rates to as close as allowed by the FIB's settings. Each dose array started approximately at $0.375\times10^{16}$ cm$^{-2}$ with the next higher dose value doubling that of the previous up to approximately $13\times10^{16}$ cm$^{-2}$. Two samples were then etched to etch heights of 10.2 μm and 20.1 μm under the same conditions as before but with a reduced Fwd power of 3 W.

Reduction of the Fwd power increased the slope of the dose array, maximizing etch mask selectivity, to amplify any etch height changes due to beam voltage. A failure of the etch mask during cryogenic etching rapidly destroys the structure, so for this experiment a loss of etch mask denoted a failure. For the 10.2 μm etch, the 5, 10, 20, and 30 kV structures required a minimum dose of $2.1\times10^{16}$ cm$^{-2}$, $1.6\times10^{16}$ cm$^{-2}$, $1.6\times10^{16}$ cm$^2$, and $0.75\times10^{16}$ cm$^{-2}$, respectively. For the 20.1 μm etch, the 5, 10, 20, and 30 kV structures required a minimum dose of $2.1\times10^{16}$ cm$^{-2}$, $1.6\times10^{16}$ cm$^{-2}$, $0.8\times10^{16}$ cm$^{-2}$, and $1.6\times10^{16}$ cm$^{-2}$ respectively. There is a possible trend of slightly improved masking ability for higher beam voltages.

For the present disclosure, the term "failed structure" refers to structures where the dosage of the masking material is insufficient and/or the etching characteristics (etch chemistry, etch time, and so forth) are incompatible with building of a desired structure.

Different accelerating voltages do result in different ion straggles and thus different effective Ga layer thicknesses, an etch mask thickness increase due to beam voltage increase. Although this experiment requires more data for clarification of how the masking mechanism depends on the implantation voltage, from this we concluded that if beam voltage did affect the critical dose, it would be by an acceptable value of less than $1.35\times10^{16}$ cm$^{-2}$ for 5-30 kV beam voltage shifts with a previously determined threshold dose of $2.2\times10^{16}$ cm$^{-2}$.

Thus far, the patterning method can be referred to as a "subtractive" approach, where input voltage is varied to implant the masking material at various depths in the host material of a given size. In another embodiment of the patterning method, the patterning method can involve an "additive" approach, where a desired structure is obtained by building up one or more layers. To counter the larger spread at higher input voltages, the "additive patterning method" can be used in combination with lower input voltages to define a desired structure. As in the previous embodiments presented in the disclosure, an exemplary system is the Si—Ga system.

Figure 15:
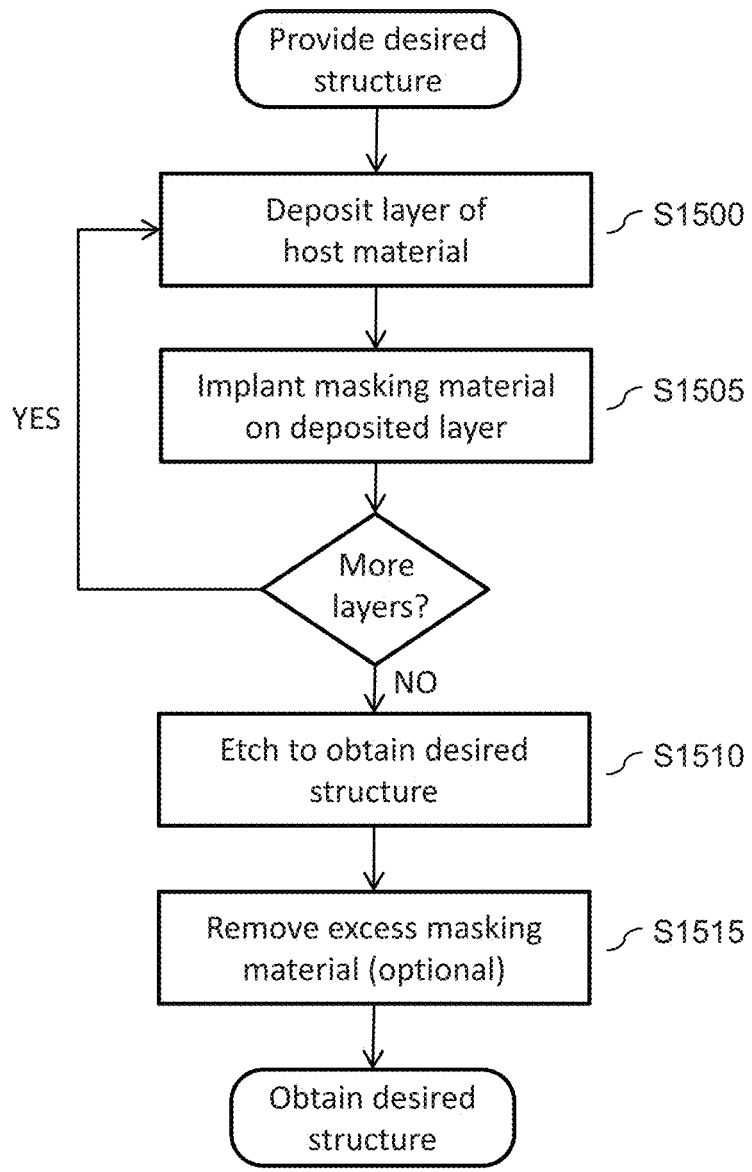
FIG. 15 shows a flowchart corresponding to an embodiment of an additive patterning method.

FIG. 15 shows a flowchart corresponding to an embodiment of an additive patterning method for fabricating a desired structure in and/or on a host material. FIGS. 16A-16E illustrate each of the steps listed in FIG. 15. For purposes of discussion, FIG. 15 and FIGS. 16A-16E will be described together.

Before the method for fabricating the desired structure in and/or on a host material can be conducted, the desired structure itself is provided. The desired structure can be defined by one or more shapes/patterns situated in and/or on the host material. A "shape" or "pattern", terms which can be used interchangeably, is any arbitrary construct that can form, alone or in combination with other shapes/patterns, the desired structure.

Figure 16A:
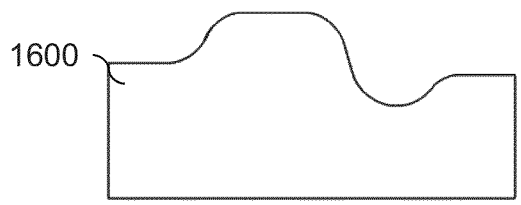
FIGS. 16A-16E show an additive patterning method for obtaining a desired structure using the method shown in FIG. 15.
Figure 16B:
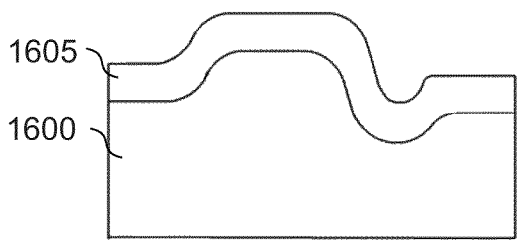

Once the desired structure has been provided, in a first step (S1500 in FIG. 15) of the additive patterning method, shown in FIG. 16B, a layer (1605) of host material is deposited on top of existing material (1600) (shown by itself in FIG. 16A) with regards to the desired structure to be obtained. The existing material (1600) can be the same material as the host material.

Figure 16C:
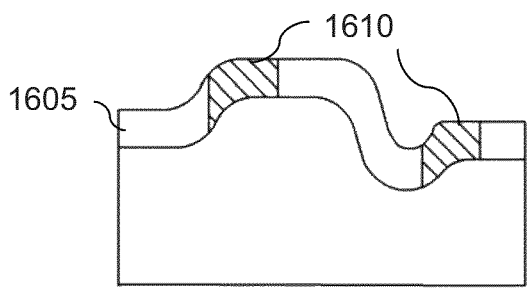

In a second step (S1505 in FIG. 15), shown in FIG. 16C, masking material is deposited in particular areas (1610) in the layer (1605). Specifically, the second step (S1505 in FIG. 15) involves defining one or more etch masks in and/or on the host material via addition or removal of the masking material. The particular areas in or on which to deposit the masking material will be in accordance with (i.e., depend on) the one or more shapes that define the desired structure.

The first and second steps (S1500, S1505) can be repeated an arbitrary number of times in order to build the desired structure one layer at a time.

Figure 16D:
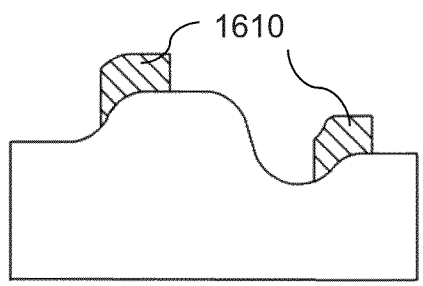
Figure 16E:
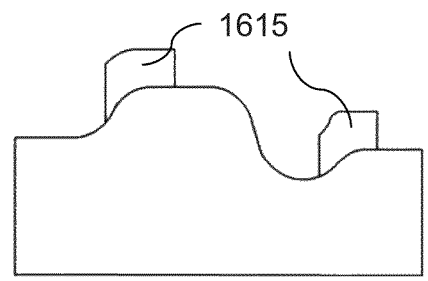

After completion of one or more iterations of the first and second steps (S1500, S1505), a third step (S1510) involves etching the system to obtain the desired structure. As shown in FIG. 16D, etch chemistry or chemistries are chosen such that the particular areas (1610) of the layer rich in the masking material are left relatively unaffected whereas areas of the layer not implanted with the masking material are removed. Specifically, the etch chemistry selectively etches the host material in areas not sufficiently protected (whether intentionally or unintentionally unprotected) by one or more etch masks. Regions of the host material that are protected or unprotected are defined based on the shapes that define the desired structure.

By way of example and not of limitation, the etching step (S1510 in FIG. 15) can be isotropic or anisotropic and/or time-varying. Actual etching process utilized is chosen based on the desired structure (the desired geometric shapes/patterns) and is generally not unique, meaning that there are usually different etching processes that can be used to obtain the same desired structure.

A fourth step (S1515 in FIG. 15), which is optional, involves removing and/or inactivating the masking material in the particular areas (1610) of the layer.

Exemplary processes for each of the deposition (S1500), implantation (S1505), etching (S1510), and mask material removal (S1515) steps are provided. An exemplary deposition process (S1500) can involve plasma-enhanced chemical vapor deposition (PECVD), a low temperature process used for deposition of amorphous silicon layers or films. An example recipe for an Oxford Instruments "Plasmalab 133" PECVD system is given as follows in Table 2.

TABLE 2

| Exemplary PECVD process | |
|---|---|
| PROCESS RECIPE | |
| 5% SiH4/95% He flow | 280 sccm |
| Pressure | 2000 mTorr |
| R.F. power | 15 Watts |
| Temperature | 300° C. |
| FILM CHARACTERISTICS | |
| Deposition rate | 17.0 nm/min |
| Deposition rate uniformity | <+/−3% across 240 mm platen |

An exemplary implantation process (S1505) can involve a focused ion beam (FIB) system used to implant gallium into silicon. Other systems, such as ion projection lithography, can also be used. In general, the FIB system allows steering of a beam (comprising gallium ions in the present discussion) to define a pattern, which functions as the etch mask. A recipe for an FEI V600 FIB system is provided in Table 3.

TABLE 3

| Exemplary implantation process | |
| --- | --- |
| INSTRUMENT SPECIFICATIONS | |
| Ion beam resolution | 5 nm |
| Accelerating voltage | 2-30 kV |
| Probe current | 1 pA-20 nA in 15 steps |
| Chamber size | 379 mm (left to right) |
| Vacuum | $<2.6 \times 10^{-6}$ mbar |
| EXEMPLARY IMPLANTATION CHARACTERISTICS | |
| Areal threshold dose | $2 \times 10^{16}$ Ga atoms/cm$^2$ |
| Implanted layer thickness | 20 nm |
| Areal throughput at 20 nA | $6.24 \times 10^{-6}$ cm$^2$/s |
| Volumetric throughput at 20 nA, 30 kV | $1.24 \times 10^{10}$ nm$^3$/s |

Thickness of a silicon layer or film is determined by geometry of the desired structure (or, stated another way, shapes that define the desired structure). The thickness is generally selected based on input voltages of the gallium implantation utilized by the gallium ion source, where the input voltages determine implantation depths of the gallium ions (as shown in Table 1). For instance, with reference to Table 1, if a 7 kV (7 keV) input is used, the thickness of the silicon layer or film can be selected to be around 100 Å, the ion implantation depth corresponding to 7 kV.

A dosing volume refers to volume of a material to be dosed at a set level. For a given material, the dosing volume is constant. For example, a cube 10 µm on each side would have a dosing volume of 1000 µm$^3$. Areal and volumetric throughputs refer to the area and volume, respectively, of a material that can be implanted per unit time. The throughput provides a rate at which implantation occurs. The throughput of a material depends on density of dose needed to prevent etching of the material, where the density of the dose is a function of the etch chemistry that is utilized.

Given the throughput, implantation time can be calculated by determining the implanted area or volume and dividing by the throughput. For example, for a dosing volume of 1000 µm$^3$, total implantation time is given by 1000 µm$^3$/($1.24 \times 10^{10}$ nm$^3$/s)=80.6 seconds.

An exemplary etching process (S1510) is an inductively-coupled-plasma reactive ion etching (ICP-RIE) process. Exemplary etching parameters for a cryogenic etch for a silicon substrate is given in Table 4.

TABLE 4

| ICP-RIE etching parameters for cryogenic etch and silicon substrate | |
| --- | --- |
| Etch parameter | Value |
| SF$_6$ | 70 sccm |
| O$_2$ | 4 sccm |
| Temperature | −130° C. |
| dc bias | 57 V |
| ICP | 900 Watts |
| RIE | 10 Watts |
| Pressure | 10 mTorr |
| He backing | 10 Torr |

For the ICP-RIE process, an exemplary etch rate is 1 µm/min. Etch profile, also referred to as directionality, with oxygen O$_2$ (the passivation gas) is generally anisotropic whereas etch profile without oxygen is generally isotropic. Specifically, the passivation layer formed by the oxygen protects sidewalls of the host material, which are walls parallel to the direction of incoming ions. Consequently, the passivation layer renders the etch profile anisotropic.

Another exemplary etching process (S1510) is a tetramethylammonium hydroxide (TMAH), which is a wet etch for selectively etching silicon. An exemplary solution is a 25-30% aqueous TMAH solution heated to 80° C. Etch rate of the (100) silicon crystal plane is about 0.6 µm/min, the (110) silicon crystal plane is about 1.4 µm/min, and the (111) silicon crystal plane is about 0.016 µm/min.

An exemplary gallium removal process (S1515) is provided by an RCA cleaning process. The RCA cleaning process comprises three steps: organic clean, oxide strip, and ionic clean. The organic clean and oxide strip steps remove surface silicon to expose buried gallium. The ionic clean step removes surface gallium. It should be noted that RCA cleaning is a general process and can be used for removing other materials aside from gallium. An exemplary RCA cleaning process is provided as follows:

1. Organic clean: Removal of insoluble organic contaminants with a 5:1:1 H$_2$O:H$_2$O$_2$:NH$_4$OH solution.
2. Oxide strip: Removal of a thin silicon dioxide layer where metallic contaminants may accumulate as a result of the organic cleaning; a diluted 50:1 H$_2$O:HF solution can be used for the oxide strip.
3. Ionic clean: Removal of ionic and heavy metal atomic contaminants using a solution of 6:1:1 H$_2$O:H$_2$O$_2$:HCl. In a Si—Ga system, the gallium will be removed by the ionic cleaning.

Figure 17:
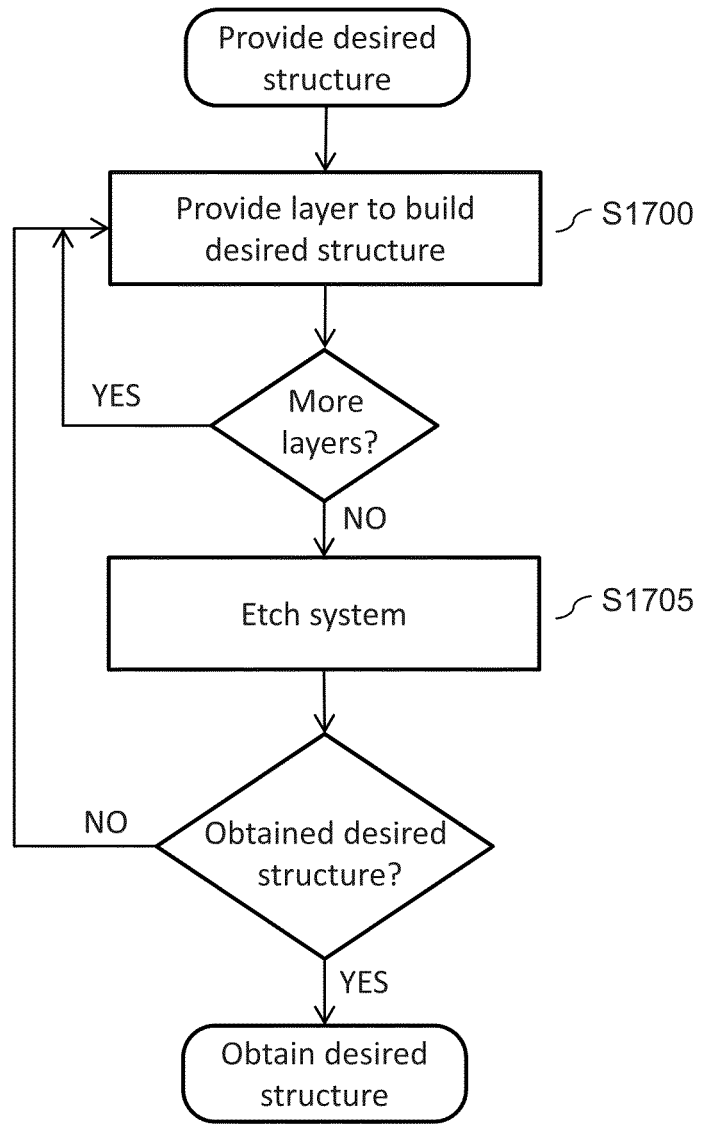
FIG. 17 shows a flowchart corresponding to a second embodiment of the additive patterning method.

FIG. 17 shows a flowchart corresponding to a second embodiment of the additive patterning method for fabricating a desired structure in and/or on a host material. The desired structure is provided and can be defined by one or more shapes situated in and/or on the host material.

In a first step (S1700), one or more layers are added to an existing material, where the layer or layers include the host material as well as areas of the host material rich in the masking material. The masking materials are defined in particular areas in or on the host material in accordance with the one or more shapes that define the desired structure. Such a layer or layers can be provided by depositing each layer of the host material followed by ion implantation of the masking material. Other methods for doping the host material can involve diffusion and doped polysilicon growth (when using silicon as the host material). A combination of these various methods can also be used in building the layers.

In a second step (S1705), etching is performed on the system. Deposition of additional layers (S1700) followed by etching of the resulting system (S1705) can be repeated until the desired structure is obtained. Depending on application of the desired structure, an optional step (not shown in FIG. 17) can be performed to remove and/or inactivate the masking material.

Figure 18A:
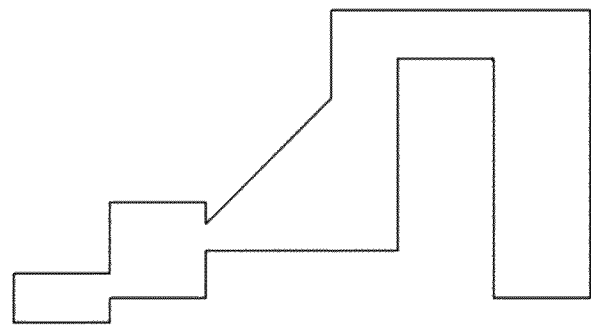
FIG. 18A shows a specific desired structure and FIG. 18B shows an exemplary etch masking profile that can be used to obtain the specific desired structure.
Figure 18B:
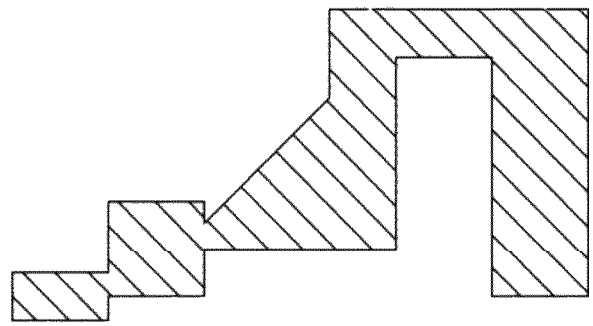
Figure 18C:
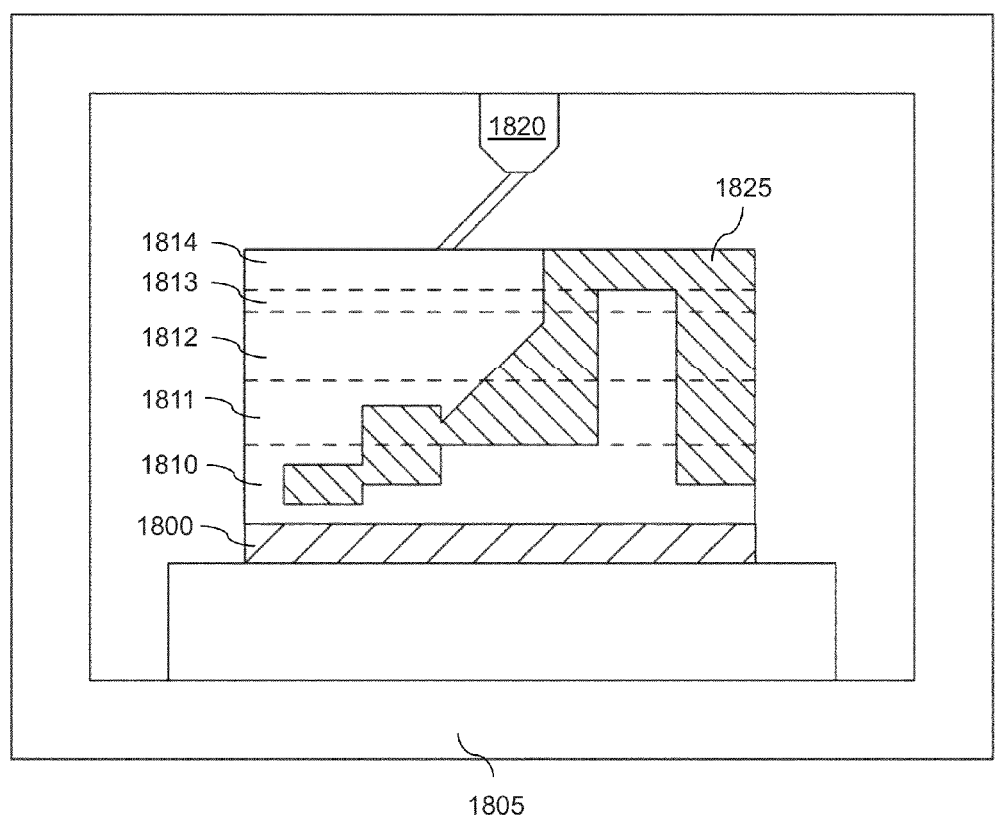
FIG. 18C shows an apparatus and a process for use in building an arbitrary desired structure in general and for use in building the specific desired structure of FIG. 18A in particular.

FIG. 18A shows a specific desired structure and FIG. 18B shows an exemplary etch masking profile for obtaining the specific desired structure. FIG. 18C shows an apparatus and a process for use in building any desired structure in general and for use in building the specific desired structure of FIG. 18A in particular (using the etch mask profile shown in FIG. 18B).

With reference to FIG. 18C, a carrier substrate (1800) is placed in a vacuum chamber (1805) capable of silicon deposition. The carrier substrate (1800) may be selected such that the carrier substrate (1800) is not etched by the same etch chemistry that etches the host material. In other cases, the carrier substrate (1800) may be of the same material as the host material but with different properties. The carrier substrate (1800) may be produced in a way that affects throughput, cost, or other figures of merit of an overall process.

For example, a Si carrier wafer/substrate may be used in a system that utilizes Si as a host material because, in some processes, the Si carrier wafer/substrate is easier to re-polish after processing than a carrier substrate not significantly etched by the etch chemistry. An etch stop layer can be used for a carrier substrate of the same material as the host material.

The carrier substrate (1800 in FIG. 18C) can be selected for convenience (as an area to place/deposit the host material) and/or for its attributes. For example, the carrier substrate can be selected to have a particular coefficient of thermal expansion (CTE) in cases where processing takes place under a variety of temperatures and/or CTE mismatches can cause significant defect.

Selecting the carrier substrate (1800) can also include lattice constant (spacing between atoms in a solid), coefficient of thermal expansion (CTE), and cost considerations. The lattice constant of the carrier substrate (1800) is generally considered if crystallinity of a final structure is desired. Mismatches in the lattice constants between the carrier substrate (1800) and the masking and host materials can lead to crystalline defects. Mismatches in the CTEs can cause stress between the materials. Consequently, temperature of the materials has to be controlled to avoid stress between the materials. Cost considerations of the carrier substrate (1800) can include actual cost of the carrier substrate (1800) itself and whether the carrier substrate (1800) can be reused in other etching processes.

Silicon deposition can occur using any deposition method, such as low-pressure chemical vapor deposition (LPCVD), atmospheric pressure chemical vapor deposition (APCVD), plasma-enhanced chemical vapor deposition (PECVD), and so forth. To begin building a desired structure, the deposition method deposits a first layer of silicon (1810) and a gallium source (1820) implants gallium into the first layer of silicon (1810) in order to define a portion of the desired structure. To continue building the desired structure, successive silicon layers (1811, 1812, 1813, 1814) are deposited and gallium implanted in each of these layers (1811, 1812, 1813, 1814). As shown in FIG. 18C, the desired structure shown in FIG. 18A is defined by gallium-rich areas (1825) in the successively deposited layers of silicon (1810, 1811, 1812, 1813, 1814).

After the desired structure has been defined in the silicon material, a wet or dry etchant can be used to remove non-gallium rich material and leave gallium rich material (1825) intact, thus releasing the desired structure from the carrier substrate (1800). It is assumed that the implanted gallium is of sufficient density ($\rho_{Ga}(x,y,z) \geq d_{threshold}$) such that the gallium can be used as an etch mask to protect, from the chosen etch chemistry, areas of each silicon layer that comprise gallium.

It should be noted that in the additive process, input voltage can be lower than when etch mask profiles are defined in bulk silicon. For instance, with reference to FIG. 18C, by implanting gallium into the first layer (1810), a smaller input voltage can be used to implant gallium at the positions depicted. In contrast, should each of the layers (1810, 1811, 1812, 1813, 1814) be deposited one after another in succession prior to implantation, followed by implantation, the same positions for the implanted gallium in the first layer (1810) would involve higher input voltages for the ion beam from the gallium source (1820).

In any given structure, the carrier substrate (such as 1800 in FIG. 18C) can be kept or removed depending on application. By way of example and not of limitation, if the structure is to be used for mechanical support or adapted to be further processed, the carrier substrate is generally kept. In another example, the carrier substrate can be removed if the structure is to be singulated into several mechanical parts.

Figure 19A:
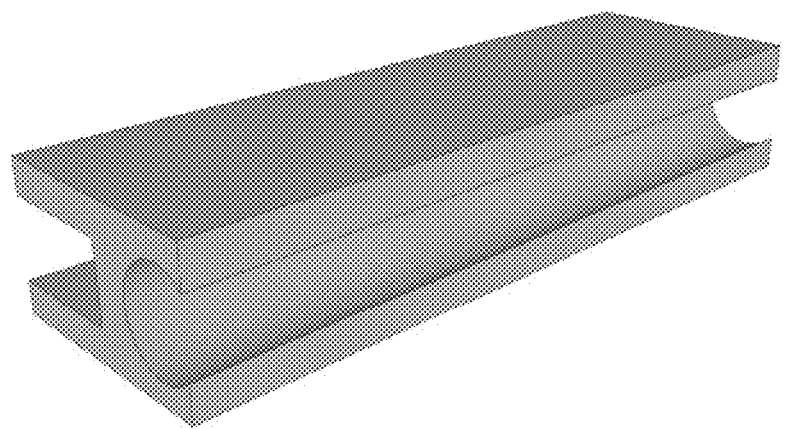
FIG. 19A shows a three-dimensional view of a desired structure.
Figure 19B:
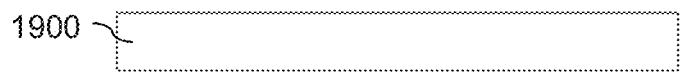
FIGS. 19B-19D show an additive process for building the desired structure of FIG. 19A.
Figure 19C:
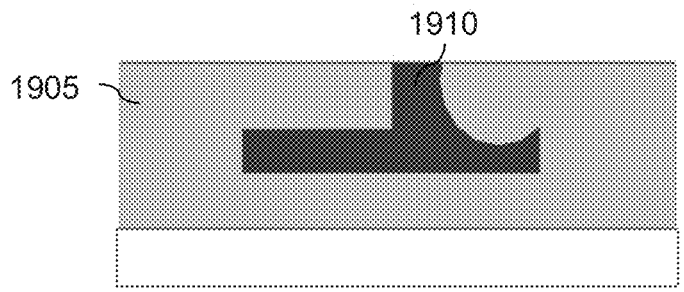
Figure 19D:
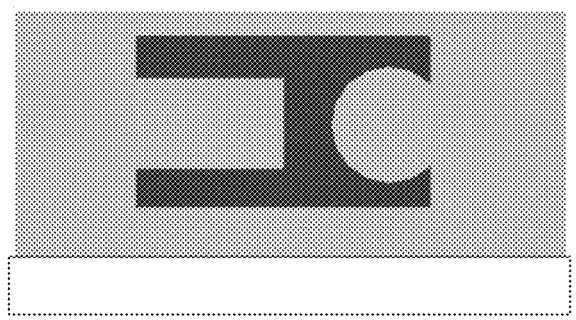
Figure 19E:
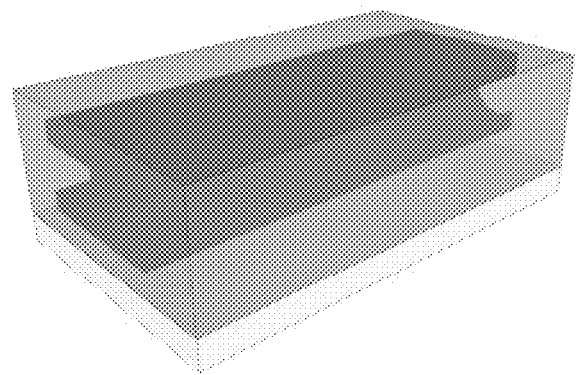
FIG. 19E shows a three-dimensional view of FIG. 19D.
Figure 19F:
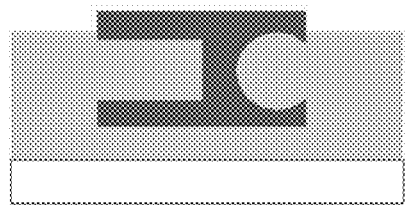
FIGS. 19F-19K illustrate an etching process, at different moments in time, performed on the workpiece shown in FIGS. 19D and 19E.
Figure 19I:
Figure 19G:
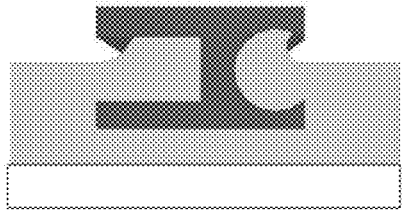
Figure 19J:
Figure 19H:
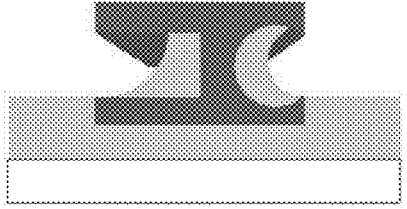
Figure 19K:
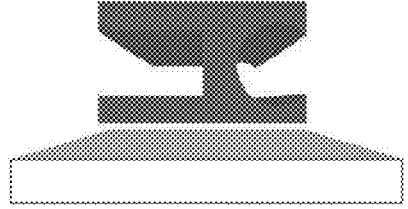

FIG. 19A shows a three-dimensional view of a desired structure. FIGS. 19B-19D show an additive process for building the desired structure. Specifically, FIG. 19B shows a cross-sectional view of a starting workpiece, which consists of a carrier substrate (1900). FIG. 19C shows a cross-sectional view of a workpiece after deposition of one or more layers of silicon (1905), used as the host material, and implantation of gallium (1910), used as the masking material, in each of the layers of silicon (1905). FIG. 19D shows a completed workpiece, where a sufficient number of iterations of silicon deposition and gallium implantation has been performed to define the desired structure. FIG. 19E shows a three-dimensional view of the completed workpiece of FIG. 19D.

FIGS. 19F-19K illustrate an etching process performed on the completed workpiece of FIGS. 19D and 19E. Let t denote time and setting $t=0^-$ as a moment in time right before etching begins on the completed workpiece of FIGS. 19D and 19E. As with previous discussions of the present disclosure, etch chemistry utilized can vary as long as the etch chemistry removes the host material (silicon) and leaves the masking material (gallium) relatively intact. For simplicity, FIGS. 19F-19K illustrate an isotropic etch. Specifically, FIGS. 19F-19K show removing of the silicon as time increases ($0 < t_1 < t_2 < t_3 < t_4 < t_5 < t_6$). At $t=t_6$, shown in FIG. 19K, the silicon has been etched away and the desired structure (shown in FIG. 19A) is released from the carrier substrate (1900 in FIG. 19B). It should be noted that FIG. 19A, which shows an arbitrary shape, can be used, for example, as an (arbitrarily shaped) interconnect for connecting different parts of a chip.

For a Si—Ga system, in cases where all gallium-rich areas are kept and all areas without gallium are removed, choice of etch chemistry can be an etch that removes silicon and keeps gallium. However, in cases where a desired structure involves keeping some of the non-gallium-rich areas, more care in control/selection of rate and directionality of etch chemistries is generally involved in determining which etch chemistry and what etch process parameters (e.g., etching concentration, etching time, and/or etching direction) to utilize to obtain the desired structure.

Figure 20A:
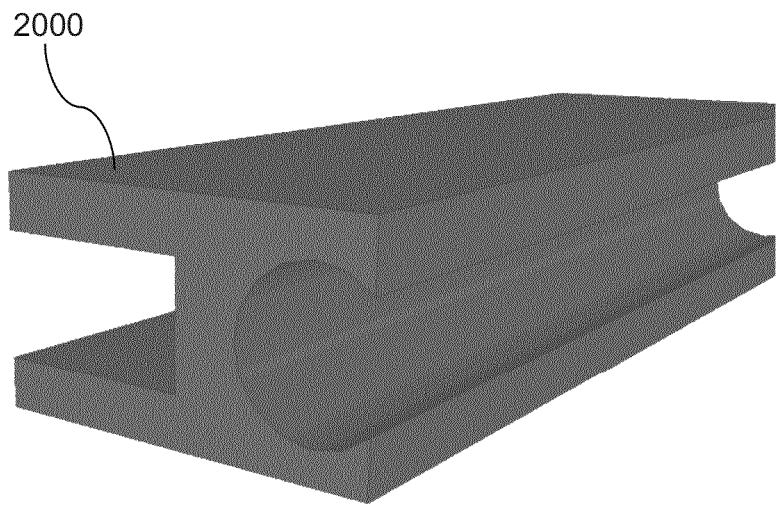
FIGS. 20A and 20B show two alternative etch masking profiles for use in defining the desired structure shown in FIG. 19A.
Figure 20B:
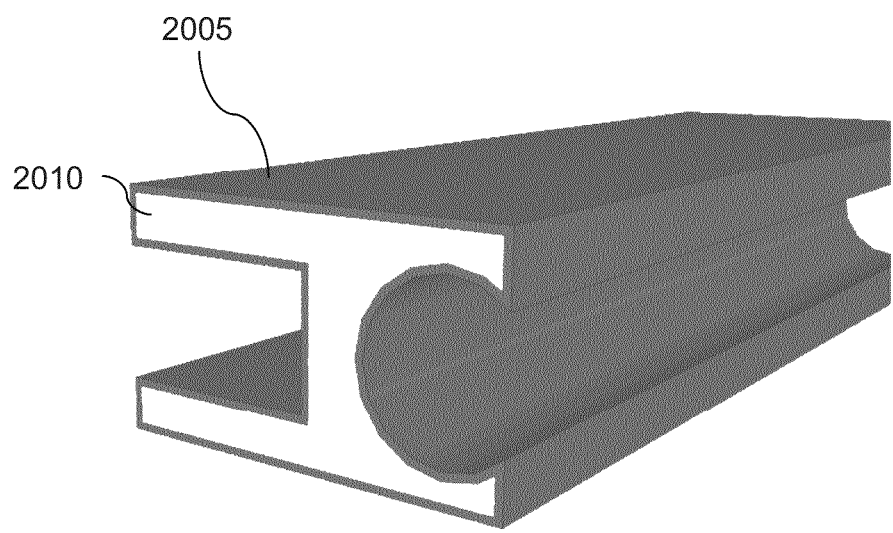

FIGS. 20A and 20B show different etch masks for defining the desired structure of FIG. 19A. FIG. 20A illustrates a case where the desired structure is defined in the silicon by implanting the entire desired structure with gallium (2000). In contrast, FIG. 20B illustrates a case where the desired structure is defined in the silicon by implanting an outline layer of gallium (2005). Silicon (2010) between the outline layer (2005) is protected from the etching process. In both cases, an optional step can be utilized to remove the gallium from the silicon. In both FIGS. 20A and 20B, the desired structure is the same. However, locations of doping utilized to obtain the desired structure are varied.

Figure 21:
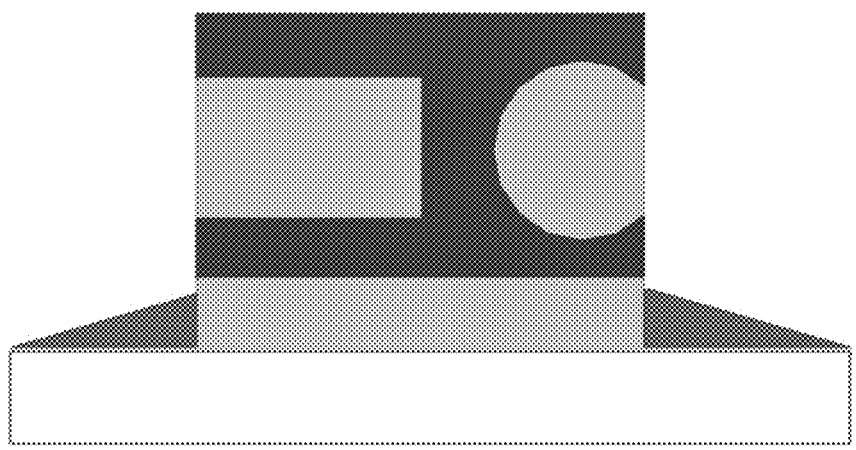
FIG. 21 shows a different desired structure obtainable from the same etch masking profiles shown in FIGS. 19D and 19E.

FIG. 21 shows a different desired structure obtained from vertical, anisotropic etching of the completed workpiece of FIGS. 19D and 19E. It should be noted that, upon removal of the gallium in FIG. 21, the desired structure would essentially be a rectangular block of silicon, which could be more easily obtained through depositing layers of silicon without gallium implantation to build the rectangular block of silicon. However, for illustration purposes, FIG. 21 exemplifies that there is generally no one-to-one relationship between an etch mask and a desired structure. Specifically, many different etch masks can be used to obtain a desired structure and, conversely, many desired structures can be obtained from a common etch mask. Specifically, aside from the materials themselves (host, masking, and carrier materials), the etch chemistry and etching process (e.g., etching concentration, etching time, and/or etching direction) also determine end structure given a doping profile.

Figure 22A:
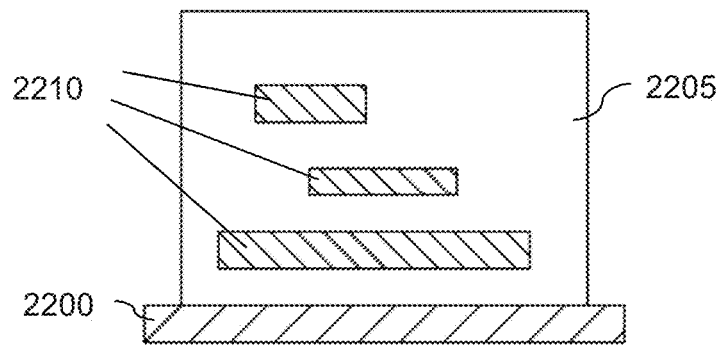
FIG. 22A shows a starting workpiece adapted to be etched.

FIG. 22A shows a particular workpiece comprising a carrier substrate (2200), deposited layer or layers of silicon (2205), and gallium (2210) implanted into the silicon (2205). Etch chemistry, etching concentration, etching time, and/or etching direction can be varied to obtain different resulting structures all beginning with the same particular workpiece.

Figure 22B:
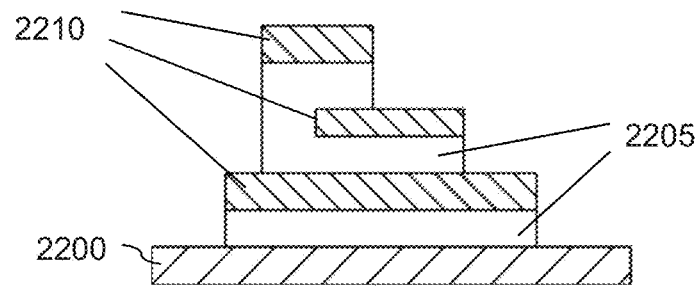
FIGS. 22B-22D each illustrates one possible result from etching the starting workpiece of FIG. 22A.
Figure 22C:
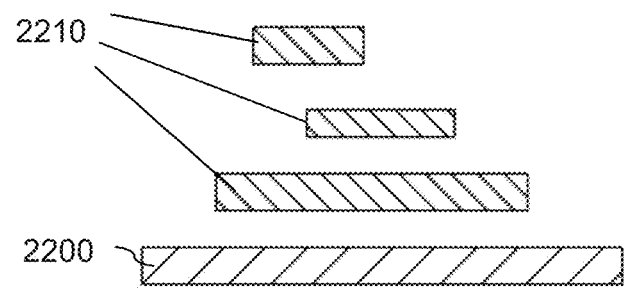
Figure 22D:
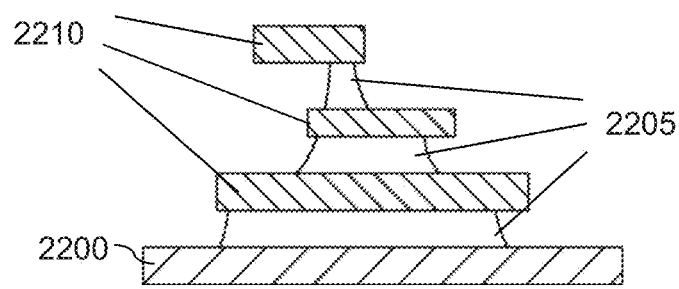

Using a vertical, anisotropic etch, the resulting structure of FIG. 22B can be obtained, where areas of the silicon (2205) not rich in gallium but directly beneath the gallium-rich areas (2210) are not etched. FIG. 22C shows a structure formed by the complete undercut limit, where all silicon not protected by an etch mask formed by the gallium is removed. FIG. 22D shows a structure formed by an arbitrary, non-anisotropic etch. The resulting structure exhibits undercutting of silicon (2205) beneath the gallium-rich areas (2210).

It should be noted that for etching processes where some silicon (without a gallium etch mask) remains in the final structure, as shown for example in FIG. 22D, the etch chemistry is generally carefully selected based on factors such as etch rate, directionality, selectivity, and so forth. For etching processes where all material without gallium is etched away, as shown for example in FIGS. 19K and 22C, the selection of an etch chemistry involves utilizing an etch chemistry that removes silicon and keeps gallium intact and is generally simpler than for the case where some non-protected areas of silicon remains in the final structure.

Figure 23A:
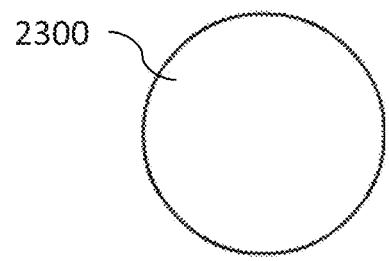
FIG. 23A shows a cross-section of another exemplary desired structure.
Figure 23B:
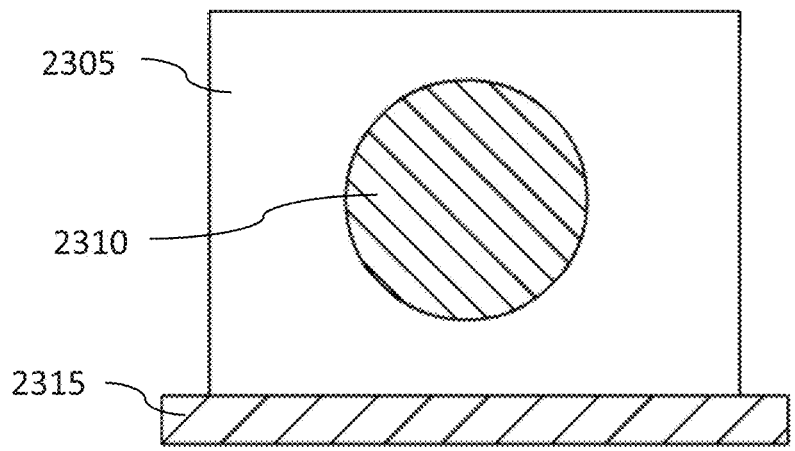
FIGS. 23B and 23C show two potential etch masking profiles used to obtain the desired structure of FIG. 23A.
Figure 23C:
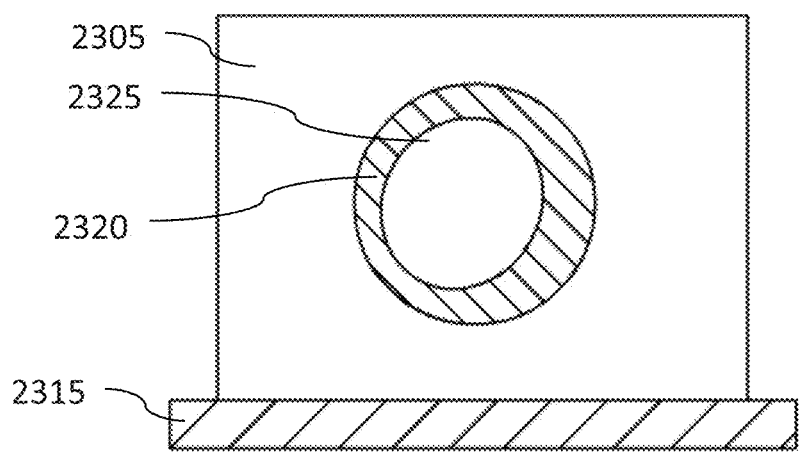

FIG. 23A shows a cross-section of a desired structure (2300), which is a "sphere" of silicon (2300). FIGS. 23B and 23C show two of potentially infinite number of possibilities of implanting gallium to obtain the desired structure (2300 in FIG. 23A). FIG. 23B shows a workpiece where a layer or layers of silicon (2305) is implanted with gallium (2310) such that the gallium completely forms the shape of the desired structure (2300 in FIG. 23A). FIG. 23C shows a workpiece where a layer or layers of silicon (2305) is implanted with a layer of gallium (2320) that essentially forms a protective shell around an embedded portion of silicon (2325). After a non-anisotropic etching of the workpieces in each of FIGS. 23B and 23C, each of the workpieces is released from a carrier substrate (2315). Gallium (2310 in FIG. 23B, 2320 in FIG. 23C) can then be removed (for instance, through annealing or diffusion processes) to obtain the desired sphere of silicon (2300) shown in FIG. 23A.

Figure 24A:
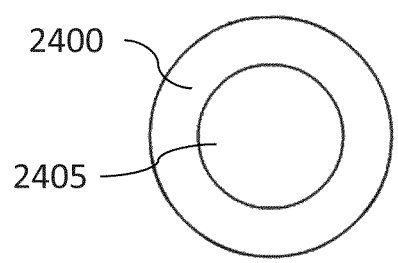
FIG. 24A shows a cross-section of another exemplary desired structure, where the desired structure has a hollow component.
Figure 24B:
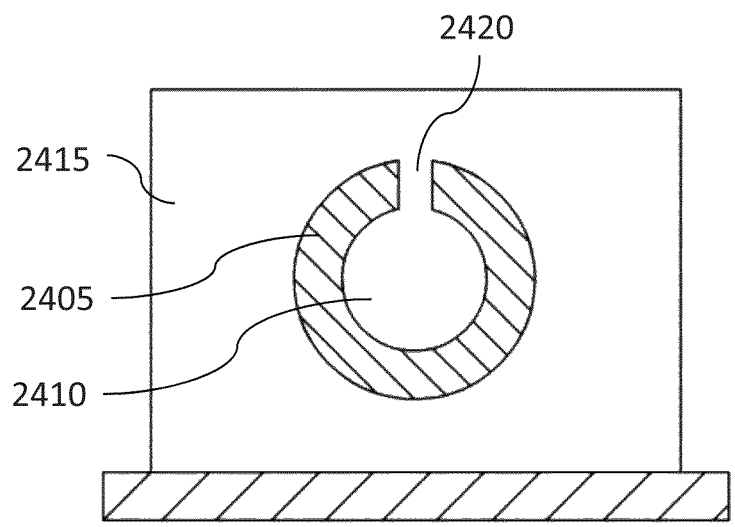
FIG. 24B shows a potential workpiece that, when etched, can approximate the desired structure of FIG. 24A.
Figure 24C:
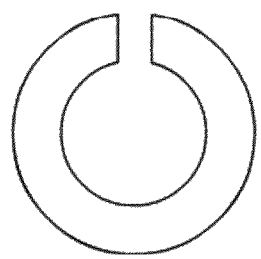
FIG. 24C shows an approximation of the desired structure of FIG. 24A.

FIG. 24A shows a cross-section of a desired structure (2400), which is a hollow sphere of silicon (2400). In a three-dimensional perspective (not shown), the hollow region (2405) is embedded from all sides by the silicon (2400). However, in order to form the hollow region (2405 in FIG. 24B), an etch chemistry generally has to come in contact with the region (2405). FIG. 24B shows a workpiece used to obtain an approximately hollow sphere of silicon. By introducing a small gap (2420) by, for instance, not implanting gallium (2405) in the region corresponding to the small gap (2420), silicon in each of regions 2410, 2415, and 2420 can be removed through etching. FIG. 24C shows the actual resulting structure, which is an approximately hollow sphere of silicon obtained by etching and gallium removal of the workpiece in FIG. 24B. It should be noted that the size of the gap (2420) is not drawn to scale in FIG. 24B; the gap (2420) can be smaller for the resulting structure to better approximate the desired structure (2400) of FIG. 24A.

Other methods can be used to define region 2010. For instance, the region 2010 can be defined by filling with a solid material (which can be referred to as a sacrificial layer or sacrificial material) around which layers of silicon can be deposited. Gallium can then be implanted in the layers of silicon. After etching, the solid material can be removed and any imperfections, such as holes, in the resulting structure can be fixed to obtain an approximation of the desired structure (shown in FIG. 24C).

In an embodiment, Ga+ mask on silicon allows patterning/etching of non-planar structures and, in particular, allows fabrication of three-dimensional structures in the substrate material using multiexposure and grayscale etch masking.

In particular, in an embodiment, multiple implantations for Ga+ etch masking can be performed regardless of sample surface topography. Experimentally, this fabrication procedure proceeds as follows: implant initial mask, etch the silicon, implant second mask, and etch the silicon. This repeating sequence can continue for as long as the Ga etch mask remains. Re-implantation of previous structures can also extend the critical height for these structures.

Figure 10:
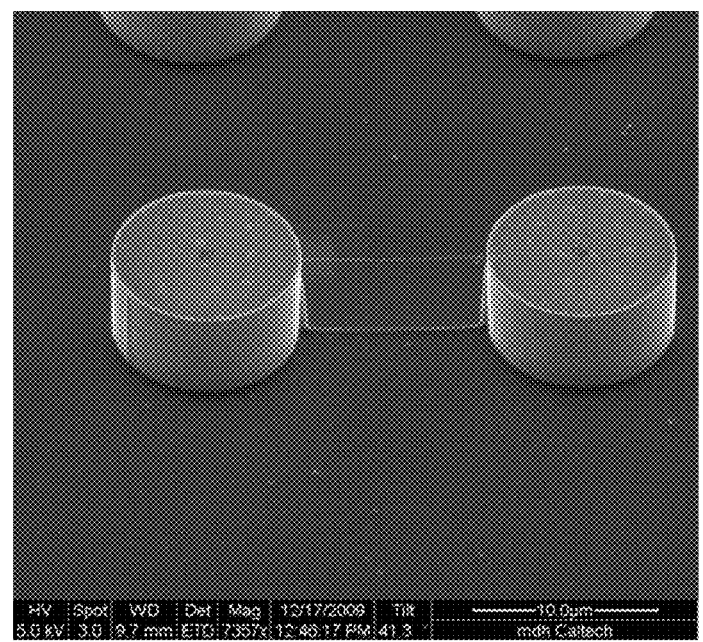
FIG. 10 shows an exemplary SEM of 10 micron diameter silicon pillars, etched 5 microns tall, with an 80 nm by 20 nm silicon nanowire suspended in between according to an embodiment herein described. In the example of FIG. 10, the wire is connected 500 nm below the top of the pillars. The thickness of the wire is consistent with the width of the Ga implanted layer.

Applicants demonstrated this technique using both the combined $SF_6/C_4F_8$ etch chemistry and the cryogenic etch to create a suspended silicon nanowire connected to two pads, as shown in FIG. 10. First, two 10 micron diameter circles separated by 10 microns were Ga implanted at a dose of $2 \times 10^{17}$ cm$^{-2}$. The structure was then etched to a height of 0.5 microns using the combined $SF_6/C_4F_8$ etch chemistry. A Ga mask was then implanted in the shape of a rectangle connecting the two pillars with the same dose as the circles. A mask undercutting cryogenic etch was then performed for an etch height of 5 microns; this step utilized the undercut to remove all unmasked silicon below the rectangle. The resulting structure was an 80 nm by 20 nm silicon nanowire suspended between two 10 μm diameter pillars etched 5 μm tall with the nanowire connected half a micron below the top of the pillars, see FIG. 10. This technique utilized the advantages of each etch, the high pattern fidelity of the combined $SF_6/C_4F_8$ etch chemistry etch and the inherent undercutting and high selectivity of the cryogenic etch. In particular, the 500 nm dimension is controlled by the composition of etching and mask-masking steps; the 80 nm by 20 nm dimension are primarily due to the conditions of the mask-making step (as described by FIG. 1 and elsewhere) This is an example of the additive nature of the process where a composition of different masks and etches can be used.

Figure 25A:
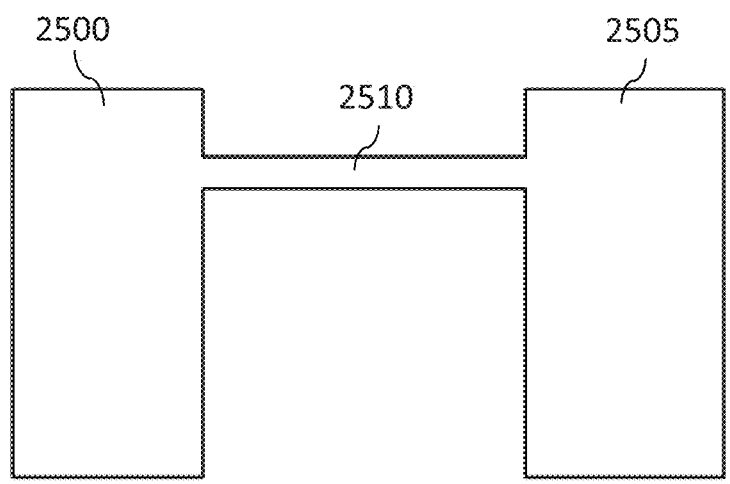
FIG. 25A shows a cross-section of an exemplary desired structure comprising two pillars and a wire suspended between the two pillars.

FIG. 25A shows a cross-section of a desired structure comprising a left pillar (2500), right pillar (2505), and wire (2510) suspended between the two pillars (2500, 2505). For the following discussion, the left and right pillars (2500, 2505) are microscale silicon pillars while the wire (2510) is a silicon nanowire. Etch masks are defined using gallium implantation. It should be reiterated that the Si—Ga system is an exemplary system. Other materials can be used for the methods described with appropriate selection of etch chemistry and implanted ion species.

The wire (2510) suspended between the two pillars (2500, 2505) is a three-dimensional structure defined by a length, width, and thickness. As used in this disclosure, the "length" refers to the dimension spanning gap between the two pillars (2500, 2505), the "width" refers to the dimension spanning a direction perpendicular to direction of implantation, and the "thickness" refers to the dimension spanning a direction parallel to the direction of implantation. In many embodiments of the silicon nanowire structure, the thickness of the nanowire is around 20 nm.

Figure 25B:
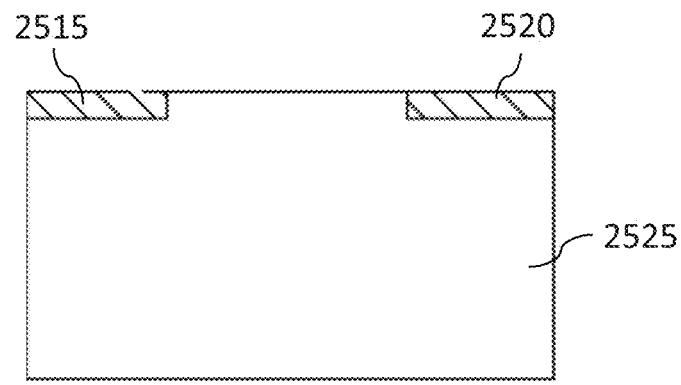
FIGS. 25B-25D illustrate one possible manner in which to obtain the desired structure of FIG. 25A.
Figure 25C:
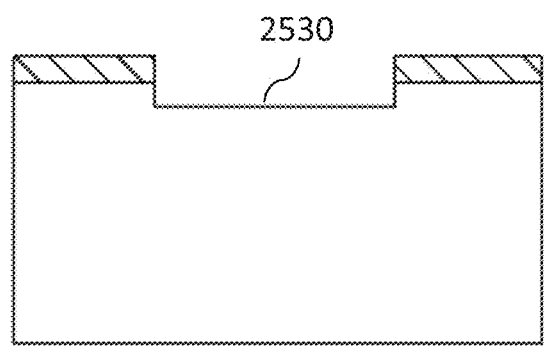
Figure 25D:
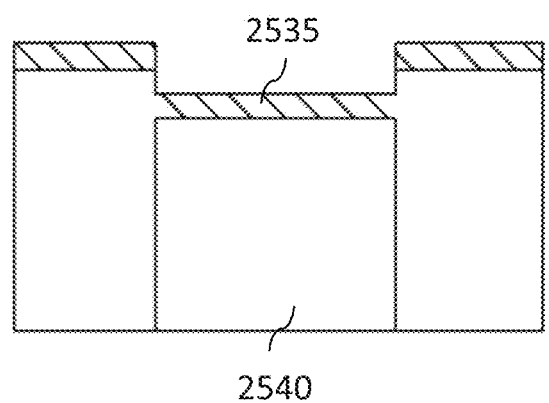

FIGS. 25B-25D show one possible manner in which to obtain the desired structure of FIG. 25A. FIG. 25B defines the pillars (2500, 2505 in FIG. 25A) by defining micron sized etch masks (2515, 2520) in silicon material (2525) via implantation of gallium. The etch masks (2515, 2520) can be defined by steering of an FIB along the silicon material (2525). Vertical, anisotropic etching is performed to obtain the structure in FIG. 25C, which exhibits vertical sidewalls.

FIG. 25D defines a nanowire structure (2535) near or on the silicon surface (2530 in FIG. 25C). The nanowire (2535) is defined by implanting gallium into the silicon using an FIB with areal doses on the order of $10^{16}$ ions/cm$^2$. Dimensions of this etch mask (2535) determine dimensions of the resulting nanowire structure (2510 in FIG. 25A). In directions perpendicular to the incident beam, size is determined by beam size and ion straggle caused by scattering of the gallium ions during implantation. In a direction parallel to the incident beam, size is determined by implantation beam voltage and ion straggle caused by scattering during implantation. As previously shown in Table 1, higher input energy (proportional to input voltage) leads to larger spread in the implanted ions. Additionally or alternatively, a range of energies, through additive combination of implantations at different depths, can be used to adjust the size of the structure.

After implantation of the gallium ions, the Si—Ga layer acts as an efficient etch mask for fluorinated plasma etch chemistries. For instance, ICP-RIE with passivated mixed-mode etch chemistries can be used to fabricate the desired nanowire structure (2510 in FIG. 25A). Specifically, two exemplary fluorinated silicon etches utilized are a cryogenic silicon etch $SF_6/O_2$ and a mixed-mode $SF_6/C_4F_8$ etch (also referred to as a pseudo Bosch etch). The cryogenic etch can be used for controllable undercutting of an implanted etch mask, such as a volume of silicon (2540 in FIG. 25D) beneath the etch mask (2535 in FIG. 25D) associated with the nanowire structure (2535 in FIG. 25D). The mixed-mode etch can be used to achieve precise structures, including nanoscale structures. Each etch can be used in isolation or in combination to achieve different structures.

As a first example, the cryogenic etch is used in isolation to obtain the nanowire structure (2510 in FIG. 25A). Specifically, the cryogenic etch is a $SF_6$ silicon etch performed at cryogenic temperatures ranging from around −90° C. to around −150° C. By injecting oxygen ($O_2$), a $SiO_xF_y$ passivation layer can form on etch sidewalls, thus protecting the etch sidewalls and allowing for high aspect ratio structures.

In the cryogenic etch, the etching process initially involves unpassivated materials because the passivation gas is injected subsequent to initial etching. Specifically, in the cryogenic etch, passivation material is a combination of etch gas and etch product. Since no etch products initially exist in the host material-mask material, no passivation occurs initially. A finite amount of time from the start of etching is involved before sufficient etch products exist to form the passivation layer. Consequently, an initial undercut, also referred to as an intrinsic undercut, occurs prior to forming of a passivation layer. The initial (intrinsic) undercut generally cannot be avoided.

Since the cryogenic etch generally involves low forward powers (low ion energies), selectivity of a gallium etch mask can be high (several thousand to one) and gallium can be used to induce a lateral undercut during the etch. Specifically, low forward power leads to high selectivity since low forward powers result in a low sputter rate of the gallium, while etching of the gallium can be practically nonexistent through selection of appropriate etch chemistries. Additionally, by utilizing a low forward power, any other forces such as electrostatic forces that vary along a surface can change ion trajectories in not insignificant ways. These forces can thus lead to undercutting of gallium.

High selectivity can be observed since, once the dose of gallium is above a $d_{threshold}$ of approximately $2 \times 10^{16}$ ions/cm$^2$, the etch mask protects silicon in the 2535 region in FIG. 25D for long etch times. Long etch times are generally those that are longer than half an hour to an hour. Undercut is around 100 nm/min and is localized to the region of silicon (2540 in FIG. 25D) directly below the etch mask (2535 in FIG. 25D).

With high selectivity and lateral undercut, the etch mask (2535) is protected and the silicon (2540) under the etch mask (2535) is effectively removed. The nanowire (2510 in FIG. 25A) formed by the cryogenic etch process can be long (longer than 20 μm) and can be connected to microscale structures, such as pillars (2500, 2505 in FIG. 25A) for contacting.

As a second example, instead of the cryogenic etch, the mixed-mode etch can be used. The mixed-mode etch, which can be used at room temperature, utilizes $SF_6$ as the etch gas and adds $C_4F_8$ as the passivation gas. In the mixed-mode etch, the passivation material itself is contained in the gas present when etching occurs, where $C_4F_8$ is the passivation gas that directly forms a $C_4F_8$ passivation layer. By tuning the mixed-mode etch, a sharply defined nanowire (2510 in FIG. 25A) can be obtained. A "sharply defined" structure is a structure having a definite extent (for instance, a well defined length and/or thickness for a nanowire) and having a reproducible geometry. In contrast, a structure that is not sharply defined can have a randomly varying dimensional extent and would not be reproducible between samples or across different identically implanted structures within the same sample.

Since the mixed-mode etch involves higher forward power than the cryogenic etch, selectivity of the etch mask (2535 in FIG. 25D) is reduced. However, achievable feature sizes can be reduced by using the mixed-mode etch instead of the cryogenic etch. Specifically, the mixed-mode etch involves an undercutting, where in a 90° etching profile the structure is shrunk inward by a deterministic amount.

With mixed-mode etches, passivation material is part of the etch gas, and thus the etching process forms passivation layers even at the start of etching. As a result, an initial (intrinsic) undercut due to etching can be prevented since passivation layers can be formed prior to any materials being etched. This is in contrast to the cryogenic etch, where an initial (intrinsic) undercut due to etching occurs because a passivation layer is formed after the initial etching because the passivation material is a combination of the etch gas and the etch products. Since no etch products initially exist in the host material-mask material for the cryogenic etch, no passivation occurs initially. A finite amount of time from the start of etching is involved before sufficient etch products exist to form the passivation layer.

The mixed-mode etch can achieve nanowire thicknesses of 30 nm in a direction perpendicular to direction of implantation (also referred to as width) and 20 nm in a direction parallel to the direction of implantation. Nanowire thickness of less than 8 nm in the direction parallel to the direction of implantation has also been achieved. Although intrinsic undercutting does not occur, the mixed-mode etch can be tuned to be re-entrant, permitting freeing up of structures from silicon substrate.

A combination of the two etches can also be used. By first etching using the mixed-mode etch, highly resolved structures are possible. By switching to the cryogenic etch subsequent to the mixed-mode etch, etch masks (2535 in FIG. 25D) can be undercut and the resulting structure (e.g., a nanowire) freed from the silicon substrate (2540 in FIG. 25D).

Figure 25E:
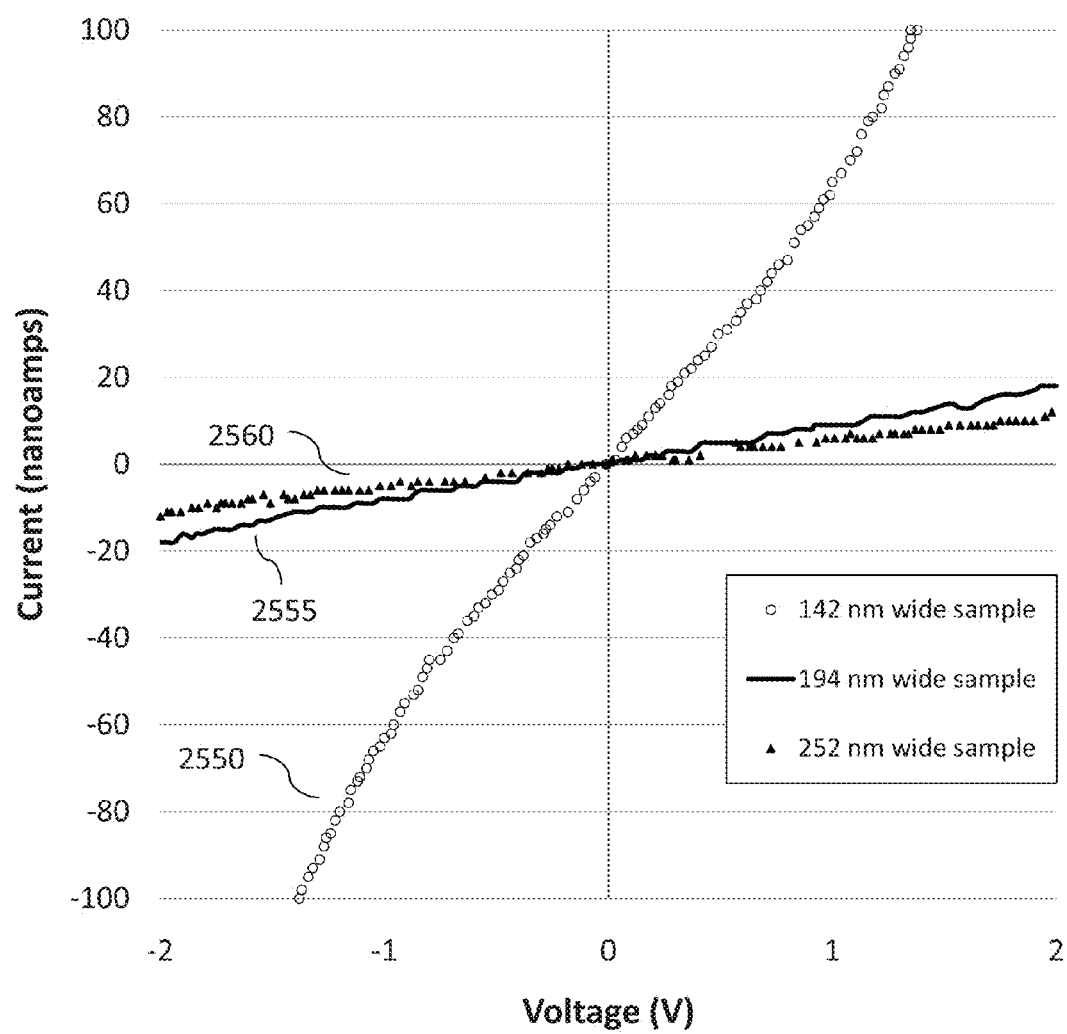

FIG. 25E shows a plot of voltage versus current for a 142 nm wide nanowire sample (curve 2550), a 194 nm wide nanowire sample (curve 2555), and a 252 nm wide nanowire sample (curve 2560). In each of these nanowires, the thickness is around 20 nm. As is well known, by Ohm's Law, resistance R is a ratio between voltage V and current I (i.e., R=V/I). For a given voltage, current across the 142 nm wide nanowire sample (curve 2550) is higher in magnitude than current across the 194 nm wide nanowire sample (curve 2555) and the 252 nm wide nanowire sample (curve 2560). Equivalently, resistance of the 142 nm wide nanowire sample (curve 2550) is smaller than resistance of the 194 nm wide nanowire sample (curve 2555) and the 252 nm wide nanowire sample (curve 2560).

Figure 25F:
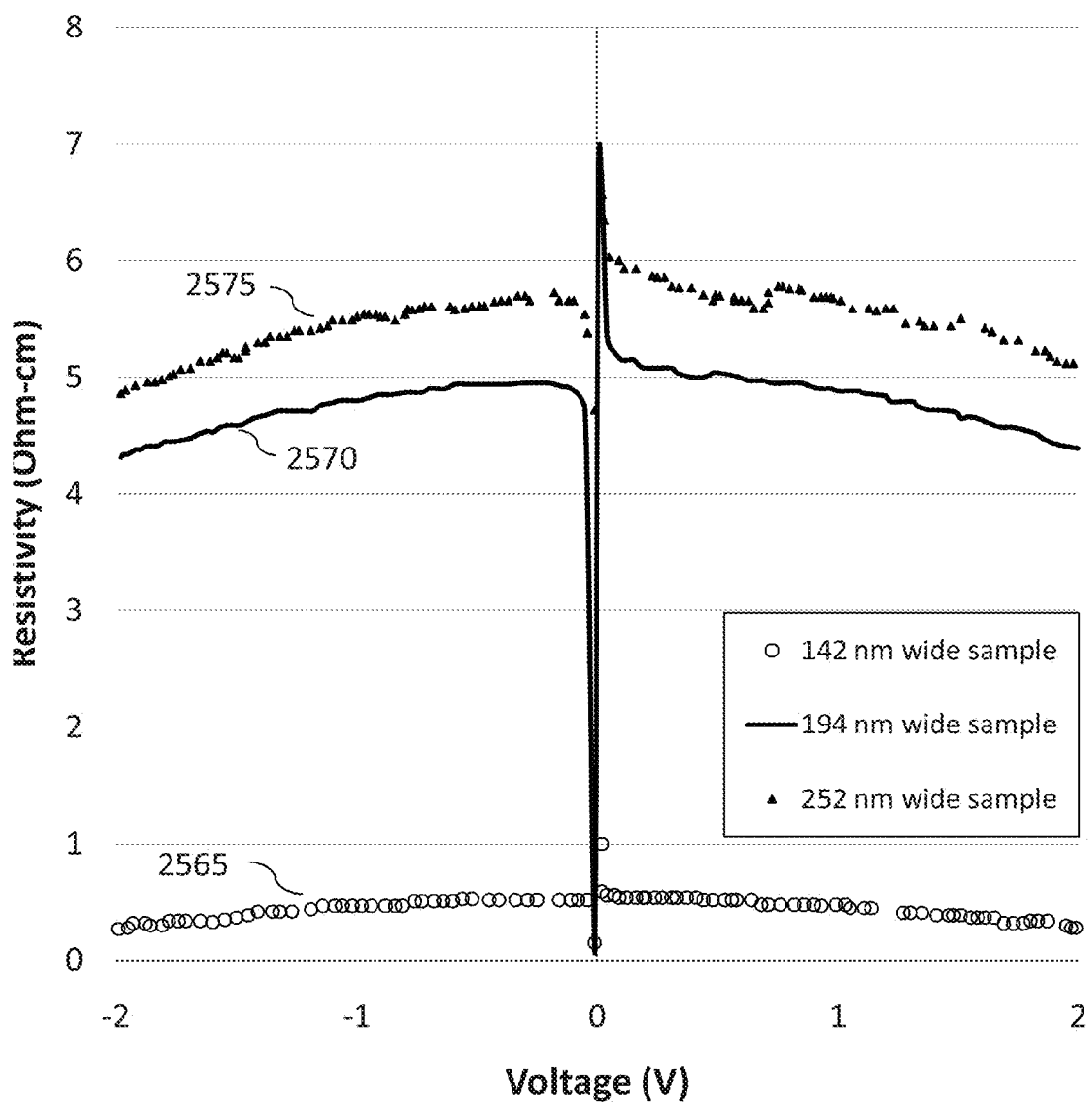
FIG. 25F shows resistivity vs. voltage curves for these wires.

FIG. 25F shows a plot of voltage versus resistivity for nanowires of different thicknesses. Specifically, resistivity is given as a function of voltage for a 142 nm wide nanowire sample (curve 2565), a 194 nm wide nanowire sample (curve 2570), and a 252 nm wide nanowire sample (curve 2575). Resistance is directly proportional to resistivity through the equation R=$\rho$(l/A), where R is the resistance of the nanowire, $\rho$ is the resistivity of the nanowire, l is the length of the nanowire (10 μm in FIGS. 25E and 25F), and A is the cross-sectional area of the nanowire. Therefore, depending on a desired resistance or resistivity of the nanowire, dimensions of the nanowire structure can be selected.

Subsequent to the etching process or processes, a gallium removal or modification process, such as an annealing process, can be performed on the resulting pillar and nanowire structure to obtain the desired structure shown in FIG. 25A. For instance, without annealing, a nanowire can have resistivity of less than 1 Ω-cm. As an example, the 142 nm wide nanowire sample has a resistivity of 0.26 Ω-cm. This is consistent with a concentration of gallium of around $2\times10^{18}$ cm$^{-3}$, which would lead to an annealed resistivity of 0.04 Ω-cm for the doped silicon nanowire [see reference 31]. The resistivity could be lower if there is also a metallic gallium conduction path. It should be noted that resistivity of gallium metal is $2.7\times10^{-5}$ Ω-cm.

Figure 26A:
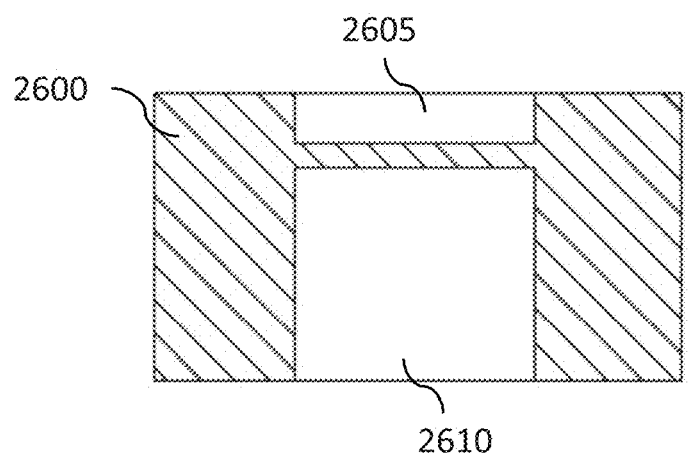
FIGS. 26A and 26B provide two alternative etch masking profiles for obtaining the desired structure shown in FIG. 25A.
Figure 26B:
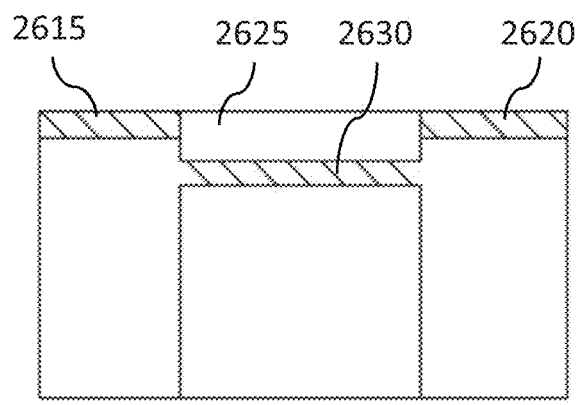

FIGS. 26A and 26B provide two possible manners in which to obtain the desired structure shown in FIG. 25A. Specifically, FIG. 26A defines an etch mask where all regions of silicon implanted with gallium (2600) are protected from a chosen etch chemistry while all regions absent gallium ions (2605, 2610) are adapted to be removed through etching. FIG. 26B defines microscale pillars (2615, 2620) as in FIG. 25B. However, instead of etching region 2625 prior to defining an etch mask for a nanowire (2630), the nanowire etch mask (2630) is implanted deeper into silicon material by applying higher input voltage for the ion beam relative to the surface implantation for regions 2615 and 2620. One or more etches, using, for instance, the cryogenic etch and/or the mixed-mode etch, can then be applied to each of the structures in FIGS. 26A and 26B to obtain the desired structure shown in FIG. 25A.

It should be noted that instead of ion implantation into bulk silicon and etching away silicon not part of the desired structure, an additive process can be utilized. Specifically, each layer of silicon can be provided, where each layer comprises either silicon or silicon doped with a masking material such as gallium. In this way, each layer is thin relative to the bulk silicon and thus, should ion implantation be utilized, lower voltages can be used to define each of the etch masks.

Silicon nanowires exhibit good electrical properties and ability to be formed on non-planar silicon surfaces, making silicon nanowires suitable for use in interconnect wires in electronics such as microprocessors.

Precision patterning of nanoscale materials generally involves patterning of a deposited masking material. However, many materials of interest may not be amenable to traditional photoresist or other similar processing methods, including but not limited to membranes, sol gels, and other porous or fragile materials. In particular, porosity and unevenness of nanostructures such as carbon nanotubes makes deposition and patterning of the masking material challenging if not impossible. However, in many embodiments of the present disclosure, resistless processing of a Si—Ga system has been performed.

In a further embodiment of the present disclosure, resistless processing of a C—Ga system is provided, with carbon as the host material and gallium as the masking material. A focused ion beam (FIB) system is utilized to implant gallium ions from multiple angles into multiwall vertical carbon nanotubes (CNTs). By selectively rastering a Ga+ ion beam across a CNT sample, the Ga atoms are implanted into the host material (in this case, carbon) at a depth of approximately 155 nm below the surface of the CNT with a lateral spread of approximately 36 nm. The fabrication of structures in carbon serves as another demonstration of fabrication in nanoscale and microscale regimes.

As previously mentioned, the patterning processes (comprising, for instance, masking material deposition and/or implantation and etching) discussed in the present disclosure can be used in a full range of materials to be etched, including silicon, silicon dioxide, diamond, compound semiconductors, and so forth. Furthermore, other ions can be used in place of gallium, such as indium. Gallium is utilized due to its availability as a suitable source as well as its inertness with many etch chemistries employed in etching. As previously mentioned, selection of an implanted ion species involves choosing an ion species that is inert to the etch chemistry used to etch the particular masking material-host material system. As an example, one could implant silicon using the same method, then etch the carbon structure using an oxygen reactive ion etch (to be discussed below). In this case, silicon is the masking material and is not significantly etched by the oxygen reactive ion etch.

Specifically, gallium has been utilized as a CNT etch mask. Ga-patterned structures have been defined on a CNT using an FIB and etched using a plasma etch. Starting samples consisted of multiwalled vertical carbon nanotubes (CNTs) of 100 μm to 500 μm in height. The Ga-patterned structures varied in size from 50 μm by 50 μm squares to 500 μm by 500 μm squares. Doses were varied from $0.4\times10^{16}$ to $9\times10^{16}$ atoms per cm$^2$ to determine the mask erosion rate and threshold dose.

Figure 27A:
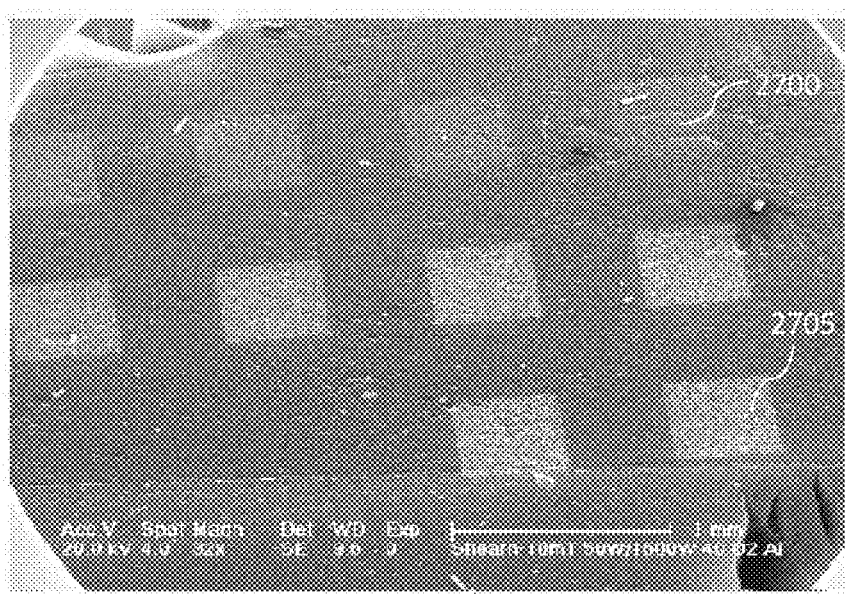
FIG. 27A shows a dose array for gallium implanted carbon nanotubes (CNTs), where brighter squares represent higher doses of gallium.
Figure 27B:
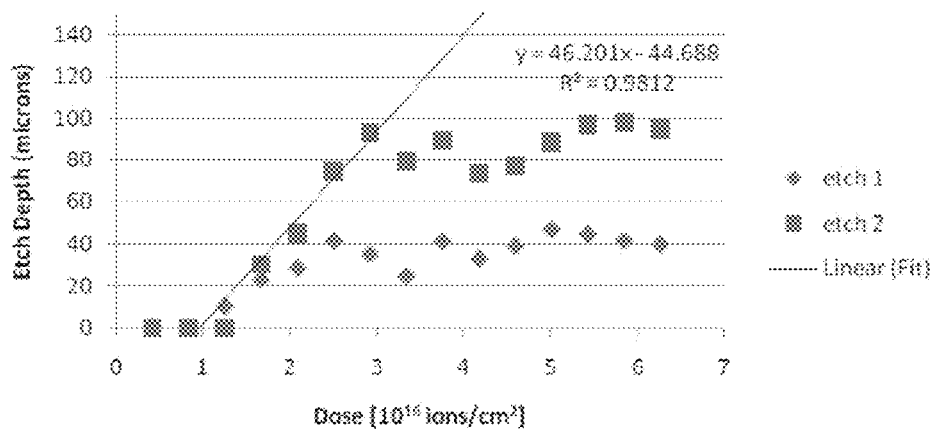
FIG. 27B shows a graph quantifying a minimum gallium dose involved in achieving a particular etch depth.

FIG. 27A shows a dose array for gallium implanted carbon nanotubes. Brightness of a given square is directly proportional to dose of gallium for the square. For instance, in FIG. 27A, square 2700 is of lower dose than square 2705. FIG. 27B shows a graph quantifying a minimum gallium dose involved in achieving a particular etch depth. A diagonal line in FIG. 27B shows minimum dose involved in achieving a desired etch depth. Each curve represents a different etch time, with a first curve (labeled "etch 1") corresponding to a shorter etch time than a second curve (labeled "etch 2"). Resulting etch depth saturates as a function of the etch time, since without sufficient etch time a desired etch depth cannot be achieved.

Below the minimum gallium dose, masking ability of the etch mask is insufficient for protecting parts of the carbon that are implanted with the gallium.

Figure 28A:
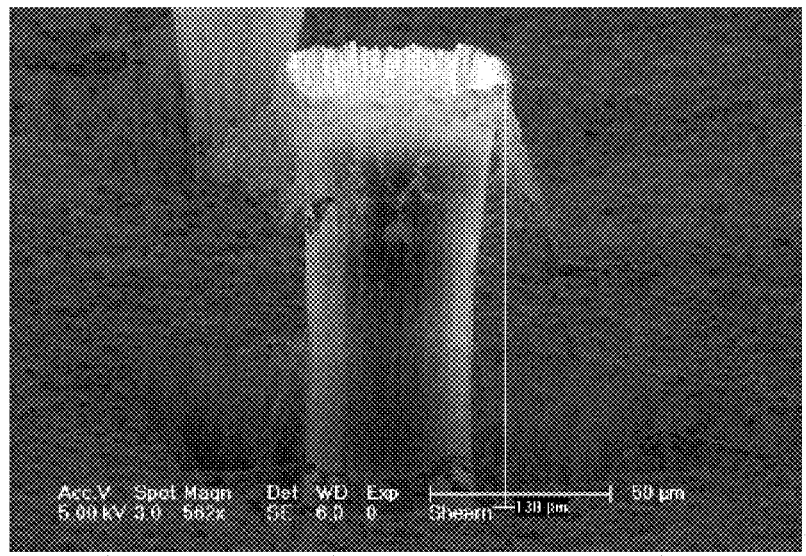
FIGS. 28A-28C show etched structures obtained from a C—Ga system. Specifically.
Figure 28B:
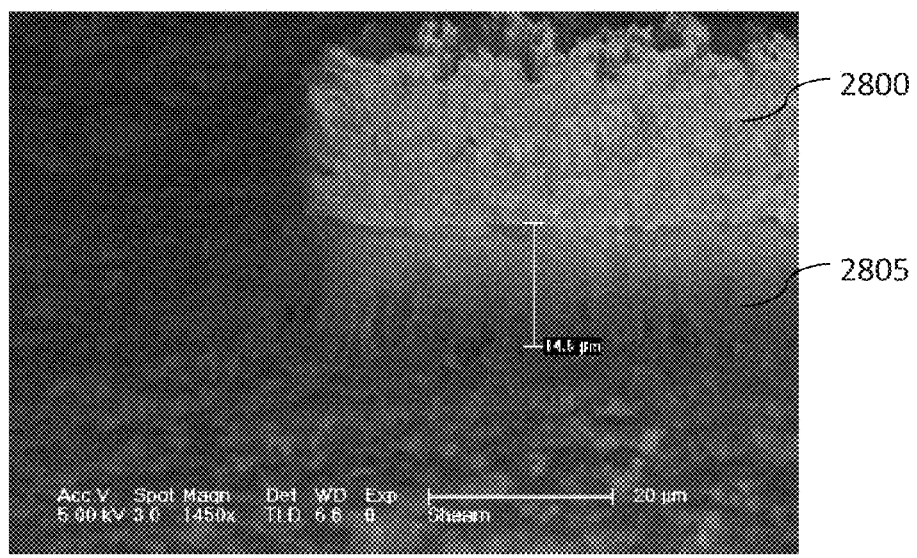
Figure 28C:
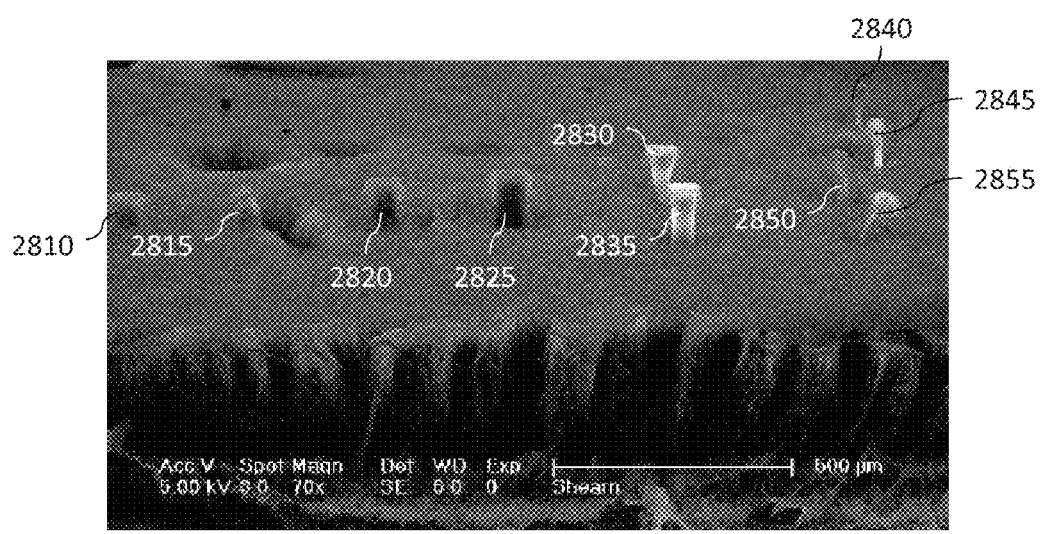

FIGS. 28A-28C show etched structures obtained from the C—Ga system. Specifically, FIG. 28A shows CNT bundles implanted with gallium and etched (using an $O_2$ plasma etch). The resulting structure is around 130 μm tall and around 50 μm wide. FIG. 28B shows CNT bundles etched to a 14.5 μm tall mesa. A Ga-rich layer (2800) appears brighter than a layer with a lower dose of gallium (2805).

FIG. 28C shows CNT bundles implanted with different doses of gallium, with lower doses toward the left and higher doses toward the right. The doses are labeled 2810, 2815, 2820, 2825, 2830, 2835, 2840, 2845, 2850, and 2855. Doses of each of these areas are given by $4.18 \times 10^{15}$, $8.35 \times 10^{15}$, $1.67 \times 10^{16}$, $3.34 \times 10^{16}$, $6.68 \times 10^{16}$, $1.34 \times 10^{17}$, $2.67 \times 10^{17}$, $5.34 \times 10^{17}$, $1.07 \times 10^{18}$, and $2.14 \times 10^{18}$ Ga-atoms/cm$^2$, respectively.

Figure 29A:
FIGS. 29A and 29B show CNT bundles implanted with different doses of gallium via ion implantation at input voltages of 5 kV and 30 kV, respectively. Within both figures, lower doses of gallium are toward the left and higher doses of gallium are toward the right.
Figure 29B:
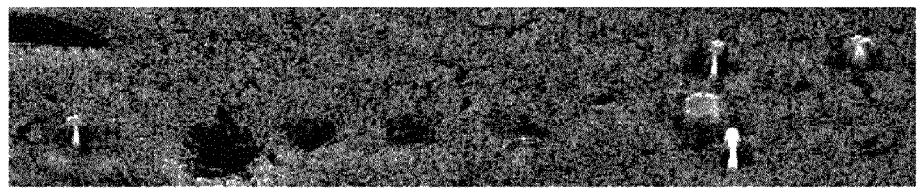

FIGS. 29A and 29B show CNT bundles implanted with different doses of gallium via ion implantation at input voltages of 5 kV and 30 kV, respectively. Dose of the implanted gallium increases from left to right. It should be noted that dose levels of gallium that allow sufficient masking of the CNT at 5 kV are insufficient at 30 kV. For a given structure, a much higher dose is utilized at 30 kV (compared to 5 kV) and can lead to feature size shrinkage. At higher voltages, the CNTs can be physically damaged by higher energy ions. Specifically, instead of implanting gallium into the CNTs, the ion implantation can instead damage the CNTs.

The structures shown in FIGS. 29A and 29B were etched using an Oxford Plasmalab 100 ICP-RIE 380 using $O_2$ as an etch gas. Etching conditions include a pressure of 5 mT, forward power of 50 W, and ICP power of 1500 W. Observation of Ga masking and CNT etching at a variety conditions was measured. Of particular note are the measurements at temperatures ranging from room temperature (15° C.) to cryogenic temperatures (−100° C.). Lowering substrate temperature not only slowed etch rate but also minimized formation of a hard-to-etch, char-like substance that presumably forms due to heating of the top part of the carbon nanotube. These long structures then have a poor conduction path to the substrate, which can cause etching to be susceptible to temperature differences.

Applicants fitted the data using the following equation:

$$h_{critical} = \frac{k_{etch}}{k_{erosion}}(d_{critical} - d_{threshold})$$

$$= \frac{10.1 \left[\frac{\mu m}{min}\right]}{0.219 \times 10^{16} \left[\frac{ions \cdot cm^{-2}}{min}\right]} \times$$

$$(d_{critical} - 0.967 \times 10^{16} [ions \cdot cm^{-2}])$$

From this fit, the value of $k_{erosion}$=$0.219 \times 10^{16}$ ions·cm$^{-2}$/min for the $O_2$ etch is in between those found for the cryogenic and mixed-mode $SF_6/C_4F_8$ silicon etch ($0.06736 \times 10^{16}$ ions·cm$^{-2}$/min and $2.45 \times 10^{16}$ ions·cm$^{-2}$/min, respectively), while the value of $d_{threshold}$=$0.967 \times 10^{16}$ ions·cm$^{-2}$ for the $O_2$ etch is close to, but slightly less, than those found for the cryogenic and mixed-mode $SF_6/C_4F_8$ silicon etch ($2.2 \times 10^{16}$ ions·cm$^{-2}$ and $1.85 \times 10^{16}$ ions·cm$^{-2}$, respectively).

Since etch bias voltage is generally associated with the erosion rate, and the etch bias voltage was between the values of the two previous Si etches, the $k_{erosion}$ can be expected to be between those of two previous Si etches. The bias voltage utilized varied depending on a particular chip. The bias voltage is proportional to forward power, which is a generally selectable parameter in an etching process.

The threshold dose for each of the three etches is close in value. The threshold dose is generally a function of physical properties of the host material-masking material system. Specifically, since gallium is involved in each of the $O_2$ etch (C—Ga system), the cryogenic etch (Si—Ga system), and the mixed-mode etch (Si—Ga system), the threshold dose of each of the C—Ga and Si—Ga systems is close to each other. The lower threshold dose for the C—Ga system may be due to the low density of the carbon material (relative to the density of silicon material). Specifically, a carbon material is generally not solid and can include voids. To achieve masking with the masking material, such as gallium material, the masking material covers the carbon material and not the voids. Consequently, less gallium per unit area can generally be used to cover the carbon material compared to covering gallium material.

Figure 30A:
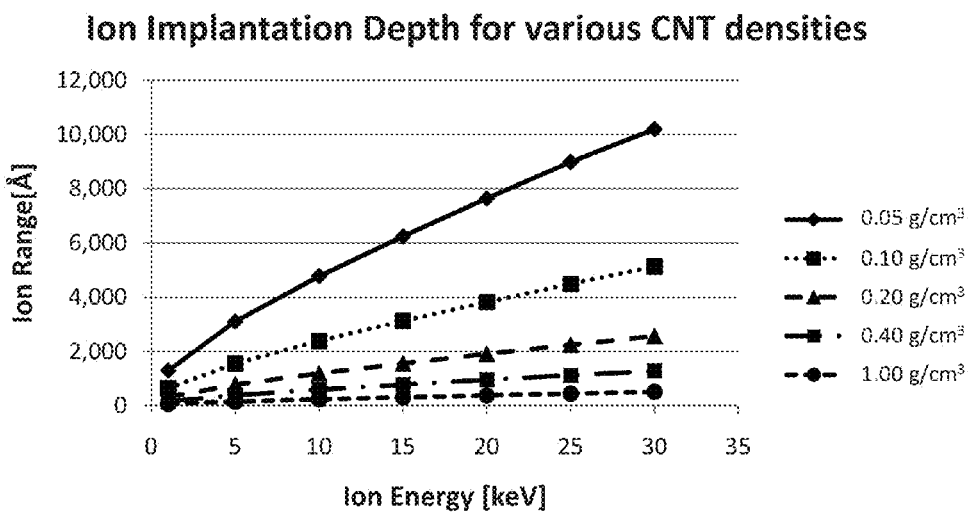
FIGS. 30A and 30B show plots of ion implantation range and ion implantation straggle, respectively, as a function of ion energies for various CNT densities.
Figure 30B:
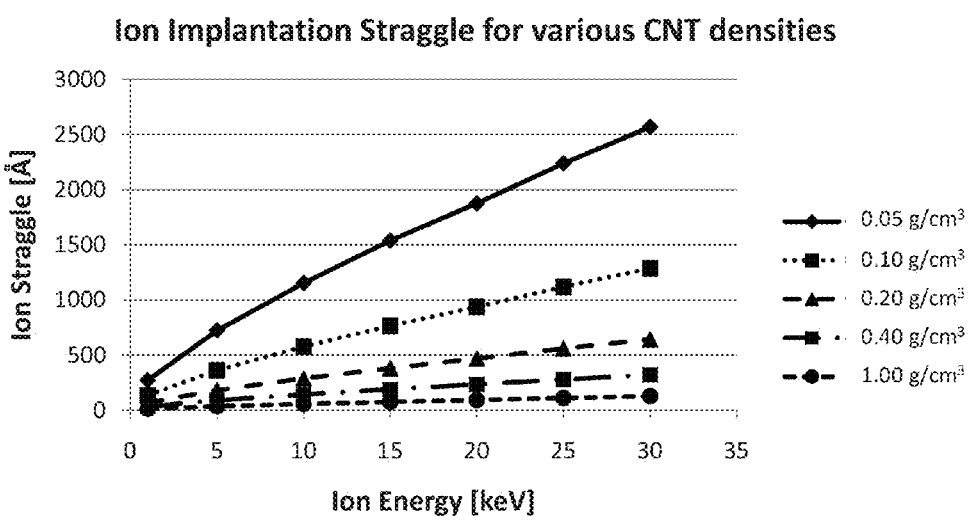

FIGS. 30A and 30B show plots of ion implantation depth (or range) and ion implantation straggle, respectively, as a function of ion energies for various CNT densities. As shown in FIG. 30A, for a given ion energy, a lower CNT density yields higher ion implantation depth. As shown in FIG. 30B, for a given ion energy, a lower CNT density yields a higher ion straggle. Relationship between ion energy and ion implantation depth as well as relationship between ion energy and ion straggle result from fewer scattering events per distance traveled between gallium ions and carbon atoms, and thus the gallium ions can be implanted deeper and spread more within the CNTs.

Specifically, increasing ion energy means more energy needs to be dissipated before the ion stops at its resting place. To dissipate the higher energy, more scattering events are involved in bringing the ion to rest. For example, in a C—Ga system, if it takes an average of ten scattering events to bring a gallium atom to rest for a particular ion energy, it can take an average of four scattering events to bring the same gallium atom to rest for an ion energy lower than the particular ion energy, where each scattering event occurs randomly but with a frequency proportional to CNT density.

If the CNT density decreases, the gallium atom travels more distance prior to reaching the ten scattering events, thus yielding higher implantation depth. Additionally and with further consideration of the case of decreased CNT density, since each scattering event sends the gallium atom in a different direction, the gallium atom would travel more distance in directions aside from the direction parallel to the ion implantation depth, thus yielding higher ion straggle (spread). These relationships between ion energies and ion implantation depth and between ion energies and ion straggle are shown in FIGS. 30A and 30B, respectively.

As an example and shown in FIG. 30B, at a CNT density of 1.00 g/cm$^3$, the Ga ion implantation straggle in the case of 5 kV structures in CNTs is expected to be approximately 36.3 nm, in contrast to 128.8 nm at 30 kV. This difference in straggle at different input voltages for the C—Ga system is larger than the difference in straggle for the Si—Ga system (shown in FIG. 1), which only increases to 20 nm at 30 kV from about 7 nm at 5 kV. Additionally, the straggle value at 5 kV in CNTs is comparable to the Si values previously discussed.

This increased straggle at higher voltages generally means that a corresponding increase in the dose is utilized, neglecting negative effects from increased damage and sputtering at 30 kV. Also, since implantation generally involves milling, the straggle should increase as a function of dose. A reason is that milling decreases density of the CNTs, such that a carbon sample with an initial dose of 0.2 g/cm$^3$ can have a dose of 0.1 g/cm$^3$ at the end of implantation. This would increase straggle, as shown, for instance, in FIG. 30B.

Figure 11:
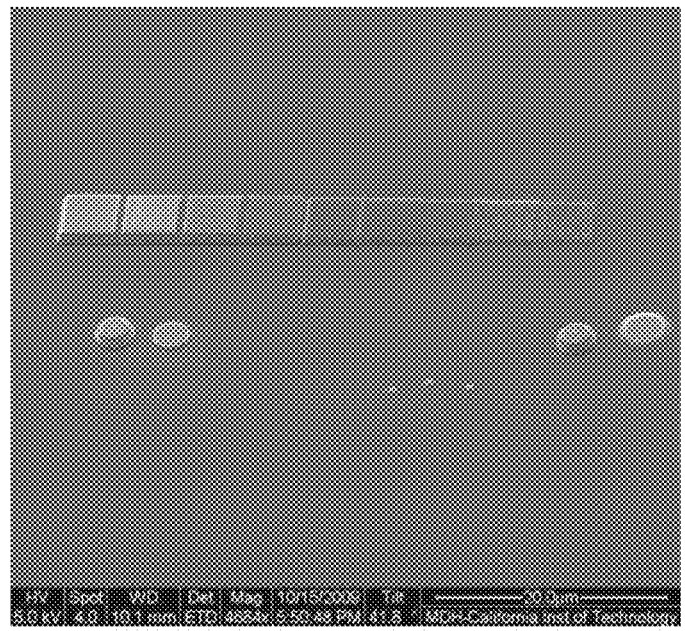
FIG. 11 shows an exemplary SEM of 5 µm squares with varied doses according to an embodiment herein described. When the etch depth increases over the critical dose depth, the structure begins to etch but maintains its relative height to its neighbor.

In an embodiment, methods and systems herein described allow creation of graded structures based on the etch depth's linear dependence on the critical dose. In those embodiments, the structures are dosed to different critical doses and etched to the desired height. At the heights corresponding to their critical dose the structures will then start to etch at the same rate as the substrate, in a manner similar in principle to gray-scale lithography [see references 13, 21]. These implanted structures can then be etched to create sloped features such as blazed gratings and optical lenses. This approach was demonstrated using nine 5 micron squares arranged in a row. Each square's dose was increased approximately $2.5 \times 10^{16}$ cm$^{-2}$ more than its neighbor square for a dose ranging from $2.5 \times 10^{16}$ cm$^{-2}$ to $22.5 \times 10^{16}$ cm$^{-2}$ and etched using the combined $SF_6/C_4F_8$ etch chemistry etch. This treatment created a stair step set of platforms as shown in FIG. 11. In particular, FIG. 11 shows an SEM of 5 µm squares with varied doses. When the etch depth increases over the critical dose depth, the structure begins to etch but maintains its relative height to its neighbor.

The theoretical limit to the highest resolution structures is highly dependent on the beam spot size and the accelerating beam voltage. These two parameters define the effective implantation masking area, as the spot size establishes the kernel to be convolved with the desired dose profile and the accelerating voltage determines the further spread of ions after interacting with the silicon. For the system according to the present disclosure, a theoretical resolution limit can be estimated by summing these dimensions in quadrature [see reference 7]:

$$d_{system}^2 = d_{spot}^2 + d_{ion}^2 \quad (4)$$

For the minimum spot size $d_{spot}$=5 nm and lateral ion spread at 5 kV $d_{ion}$=3.2 nm+1.8 nm (1 sigma straggle), resulting in $d_{system}$=7.07 nm. For the experiments at 30 kV, $d_{ion}$=9.9+5.6 nm, resulting in $d_{system}$=16.2 nm, as compared to our minimum realized structure of 43 nm. This analysis does not take into account any excess resolution loss from deflection error, exposure scheme (amount of overlap between shots was 50%), defocus, or other experimental parameters which can account for the measured minimum [see references 18, 19].

To achieve the greatest etch depths, and hence highest selectivity, it is desired to maximize the amount of Ga present in the top layer. However, further exposure of the beam past a certain dwell time leads to a steady state where the influx of Ga$^+$ is balanced by the sputtered Ga.

Figure 12:
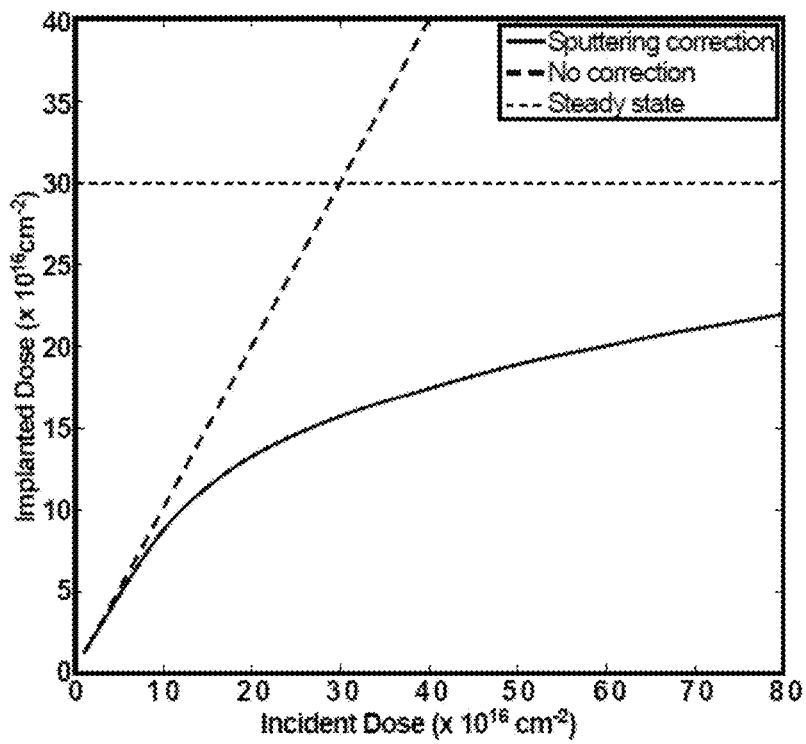
FIG. 12 shows a plot of implanted dose as a function of incident dose. In the example of FIG. 12, the limiting value is $3 \times 10^{17}$ Ga atoms/cm$^2$.

FIG. 12 shows the amount of Ga present in the silicon sample, areal dose, as a function of total ion flux for a 30 kV beam. This is approximated by from the total flux of Ga atoms minus the sputtered Ga atoms, using the composition-dependent sputter yield computed by Monte Carlo simulation [see reference 5].

As expected, for low doses the areal dose implanted is linear with total flux, as the sputtered material has a relatively low concentration of Ga relative to the amount implanted. However, as the sputtered depth approaches the mean implantation depth of 27 nm, the total concentration of Ga in the sputtered material increases. By 28.4 nm the areal concentration is of $10^{17}$ Ga atoms/cm$^2$, which is lower than total incident flux by 16%. The Ga sputter yield rapidly increases from this point, requiring an enormous amount of incident flux to increase the implanted concentration. As an example, doubling the concentration from $10^{17}$ to $2 \times 10^{17}$ Ga atoms/cm$^2$ requires more than five times the incident flux leading to a mask 144 nm below the surrounding substrate.

The maximum implanted value at steady state, calculated to be $3 \times 10^{17}$ Ga atoms/cm$^2$, is dependent on the ratio of the mean implantation depth and the sputter yield. For the two etch chemistries discussed above, this leads to a theoretical maximum etch depth of 3406 nm for the combined $SF_6/C_4F_8$ etch chemistry and 425 µm for the cryogenic etch chemistry and a maximum effective selectivity of 85 and 10625 respectively assuming a 40 nm mask layer. However, practically achievable figures will be lower, as determined by fidelity requirement and the point of diminishing returns in implantation, where the selectivity increase is less than the amount milled by the Ga beam.

Based on SRIM simulations, the 1-sigma average density of Ga assuming no phase segregation or preferential removal of silicon is approximately 14% of the density of a pure Ga layer. However, silicon's low solubility in Ga is well known [see reference 17], so the assumption of complete segregation of the implanted Ga combined with measured Ga lattice constants leads to a figure of 5.11-8.66 equivalent monolayers of Ga present at the threshold dose [see reference 2]. These data support the conclusion that the etch masking mechanism can possibly be provided by the formation of a contiguous Ga layer that forms involatile compounds in fluorine-based chemistries and fails once the layer is breached via physical sputtering of the mask. The etch mechanism indicated herein is not intended to be limiting and is herein provided only for guidance purposes.

In general, a material etch rate can be an arbitrary function of direction depending on etch chemistry used. By characterizing the rate in the various directions, a resulting structure can be predicted as a function of etching time for a given etch mask profile/geometry.

Figure 31:
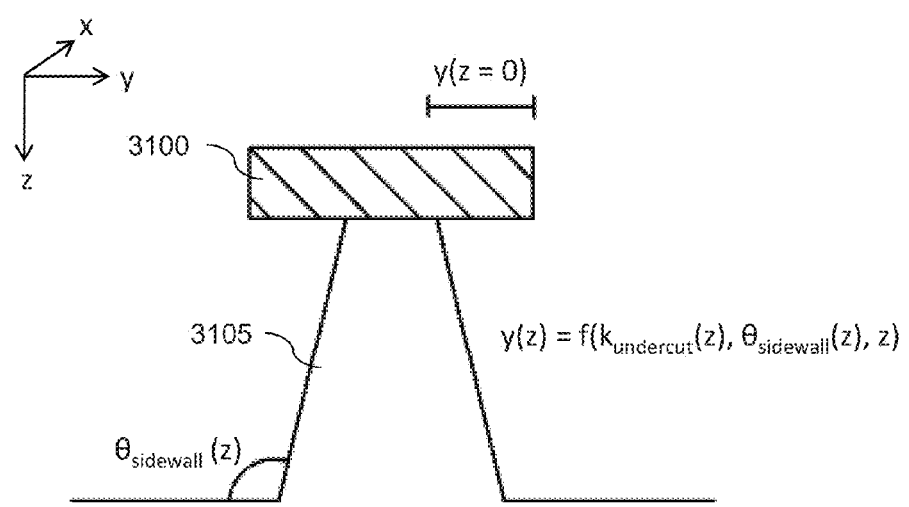
FIG. 31 shows geometry of an arbitrary, resulting structure after etching.

FIG. 31 shows geometry of an arbitrary resulting structure after etching. Specifically, a gallium-rich area (3100) within silicon material (3105) is etched negligibly compared to the non-gallium rich areas of the silicon material. Given experimentally measured parameters, such as values for $k_{etch}$, $k_{erosion}$, $d_{threshold}$, as well as any other etch parameters, specific geometry of the resulting structure can be determined. For instance, amount of undercut at a specific location z=0 can be given by $y(z=0) = k_{undercut}(z=0) \times t_{etch}$, where $k_{undercut}(z=0)$ is the etch rate along the y-direction at z=0 and $t_{etch}$ is the etch time utilized to obtain the resulting structure shown in FIG. 31.

At any arbitrary z, amount of undercut can be quantified by $y(z) = f(k_{undercut}(z), \theta_{sidewall}(z), z)$. To precisely obtain a desired structure, geometry of the desired structure is utilized to select locations at which to implant gallium as well as an etch chemistry or etch chemistries and an etch time for each etch chemistry used. Directionality, selectivity, and/or rate of the etch chemistry or chemistries used can be taken into consideration. To obtain the desired structure, constraints of available etch chemistries, doping methods, patterning methods, and number of distinct steps is considered.

General considerations involve time, yield, consumables, and so forth in a processing environment. These considerations vary depending on the processing environment, and there is generally no solution that optimizes each consideration individually. The constraints generally involve temperatures and materials utilized in the processing environment. For instance, temperatures that are too high for a given material or system can cause undesired diffusion, and changes in temperature can cause stress due to different CTE between the materials. A host material-masking material system may also need to be absent of certain other materials. For instance, the conduction properties of doped silicon can be negatively impacted by the presence of gold.

An inverse prediction from a desired structure to a starting structure is generally more difficult. For simple structures, a Green's function or similar method for working back from a desired geometric distribution (a desired structure) to the original etch masking profile is possible.

Consider a case of a rectangular transfer function utilized to build the desired structure. Further, consider that the desired structure is a vertical structure, where $\theta_{sidewall}(z)=90°$ and $y(z)=y(0)$ for all z greater than the etch depth. A continuous shape of the vertical structure can be approximated by adding up the rectangular transfer functions to build the desired structure.

For more complex structures, a given starting structure can be defined by the etch masking profile. An initial starting structure can be based on previous experimental data/information or previous experience. Specifically, an initial step involves defining an experimental structure through a set of etch masks, where the set of etch masks define the etch masking profile. Assumptions, such as transfer functions not being pattern dependent, are generally utilized during adjustments in the first few iterations of the prediction process.

The experimental structure can then be etched using a set of etching parameters to obtain an intermediate (resulting) structure. By etching the starting structure, the resulting structure is obtained, which can be compared to the desired structure. One or more etching parameters, such as, for instance, etch masking profile, etch chemistry, and/or etch time can be adjusted in order to better define the starting structure that can be utilized to obtain the desired structure.

Information can be obtained by simulating and/or physically etching a pattern using a desired etch chemistry under various etch times. This information can be stored in a library for matching between various etch masks and resulting structures for different etch times. To define an initial structure to obtain a desired structure (or vice versa), the information from the library can be used as either a starting point for the initial structure or the desired structure.

Other etching parameters such as pressure and temperature in which the structures are also involved in the structure prediction process. For instance, diffusion of the masking material into the host material depends on pressure and temperature (among other parameters). The diffusion can function in opposing manners. On one hand, the diffusion can spread more of the masking material within the host material, thus protecting more locations within the host material from etching. On the other hand, the diffusion can reduce dose of the masking material to below the threshold dose $d_{threshold}$, thus increasing the etch rate of that particular location. Numerical techniques, including simulations, can take into account these parameters and can be used to iteratively refine the starting structure.

An objective function, also referred to as a cost function, can be used to determine whether further iterations should be performed. The objective function can be calculated using, for instance, sum of absolute or squared errors between simulated and desired points and mean square errors between the simulated and desired points. The objective function can enforce a set geometric tolerance, such as a criterion of difference between corresponding simulated and desired points (e.g., difference between corresponding points in simulated and desired structures must be less than 1 micron). Number of iterations involved in a simulation can be based on a pre-set number of iterations, a value for the objective function (generally a function of a difference between the simulated and desired points), or a combination thereof.

During the simulated or actual etching process, an etch mask can be defined in the host material and etching can be performed to obtain an actual structure that can be compared with the desired structure. The comparison is made with respect to the objective function, which provides criterion or criteria with which to evaluate the actual structure. The etch mask and/or etching parameters can then be adjusted based on differences between the structures. For instance, if a particular feature is too small, more masking material can be added to an area corresponding to the particular feature (to better protect the area from etching). In contrast, if a particular feature is too large, less masking material can be added to the area corresponding to the particular feature. The number of iterations of adjusting followed by etching and comparing can be determined based on one or more criteria, where each criterion can be a set number of iterations, a value for the objective function, or a combination thereof.

In summary, provided in the present disclosure are methods for designing, fabricating, and predicting shape formations in a material that, in several embodiments, allow fabrication of micro and nano structures by etching masked material with high fidelity resolution and selectivity. In particular, in several embodiments, the methods and systems herein described allow to beam lithography for micro and nanoscale silicon reactive ion etching.

According to a first aspect, in a method for fabricating structures in or on a substrate through etch masking, a method is described to determine a minimum etch mask dosage or thickness as a function of etch depth or a maximum etch depth as a function of etch mask implantation dosage or thickness. The method comprises determining a substrate etch rate ($k_{etch}$); determining a mask erosion rate ($k_{erosion}$); and determining a threshold dose ($d_{threshold}$). The method further comprises determining the minimum etch mask dosage or thickness ($d_{critical}$) or the maximum etch depth ($h_{critical}$) according to the function $$h_{critical} = \frac{k_{etch}}{k_{erosion}} \times (d_{critical} - d_{threshold}).$$

According to an embodiment of the first aspect, the etch masking can occur via implantation. More in particular, the implantation can be ion implantation.

According to an embodiment of the first aspect, the etching can occur by way of a fluorinated etch chemistry.

According to an embodiment of the first aspect, the substrate can be a substrate made of a group IV element or a component of a group IV element. More in particular, the substrate can be a silicon substrate, carbon substrate, silicon dioxide substrate, graphite substrate, or diamond substrate.

According to an embodiment of the first aspect, the substrate can be a silicon or silicon dioxide substrate and the etch chemistry can be a fluorinated etch chemistry.

According to an embodiment of the first aspect, the addition of masking material can be via Ga+ ion implantation. More in particular, the Ga+ ion implantation can be a focused ion Ga+ ion beam implantation.

According to an embodiment of the first aspect, the fluorinated etch chemistry can be a combined $SF_6/C_4F_8$ etch chemistry in case of a first structure and a cryogenic fluorine ($SF_6/O_2$) etch chemistry in case of a second structure. More in particular, the first structure can be a nanoscale structure and the second structure can be a microscale structure.

According to an embodiment of the first aspect, the substrate can comprise one or more non-planar surfaces and the patterning can occur on said one or more non-planar surfaces. More in particular, the addition of masking material is via non-orthogonal ion implantation, wherein the non-orthogonal ion implantation can occur through inclination of the substrate with respect to an ion implantation source.

According to an embodiment of the first aspect, the substrate can be silicon and the implantation can be Ga+ ion implantation.

According to an embodiment of the first aspect, the addition of masking material can be via ion implantation, said ion implantation forming implantation layers acting as etch masks.

According to an embodiment of the first aspect, the structures fabricated can be nanoscale structures.

According to an embodiment of the first aspect, the method of the first aspect can further comprise selecting a structure size upon selection of an etching depth.

According to an embodiment of the first aspect, the determining the substrate etch rate in the first aspect can comprise measuring height of a material of the substrate after a certain amount of time during which etching is performed and calculating a ratio between the height and the amount of time.

According to an embodiment of the first aspect, the determining the mask erosion rate in the first aspect can comprise implanting or depositing a set masking dose in/on a sample area; etching the sample area until failure of masking, thus determining a time o failure; and calculating a ratio between the masking dose and the time of failure.

According to an embodiment of the first aspect, the determining the threshold dose in the first aspect can comprise implanting or depositing a plurality of doses in/on a sample area; etching the sample area for an arbitrarily small amount of time; and determining a dose for which failure of masking occurs for said arbitrarily small amount of time.

According to a second aspect, a method for fabricating structures in or on a substrate is described. The method comprises patterning one or more etch masks in or on the substrate via addition or removal of a masking material according to an etch mask dosage or thickness; and etching the substrate with an etch chemistry. In the method the etching depth is a function of the etch mask dosage or thickness by establishing a maximum etching depth obtainable with said etch mask dosage or thickness, or a minimum etch dosage or thickness to obtain a desired etching depth; and the etch chemistry selectively etches the substrate with respect to the one or more etch masks.

According to an embodiment of the second aspect, the addition of a masking material is via ion implantation.

According to an embodiment of the second aspect, the etch chemistry can be a fluorinated etch chemistry. More in particular, the fluorinated etch chemistry can also include substrate sidewall passivation.

According to an embodiment of the second aspect, the addition of masking material can be via ion implantation, and the method in the second aspect can further comprise measuring a minimum areal dose of ions to be implanted via the ion implantation to achieve a given etched depth in the material.

According to an embodiment of the second aspect, the patterning and etching steps can be repeated multiple times.

The examples set forth above are provided to give those of ordinary skill in the art a complete disclosure and description of how to make and use the embodiments of the methods for designing, fabricating, and predicting shape formations in a material of the disclosure, and are not intended to limit the scope of what the inventors regard as their disclosure. Modifications of the above-described modes for carrying out the disclosure can be used by persons of skill in the art, and are intended to be within the scope of the following claims.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

LIST OF REFERENCES

[1] Tseng A. A. Recent Developments in Nanofabrication Using Ion Projection Lithography. Small 2005, 1: 594-608.

[2] Barrett C. S. and Spooner F. J. Lattice Constants of Gallium at 297° K. Nature 1965, 207: 1382.

[3] Chekurov N., Grigoras K., Peltonen A., Franssila S. and Tittonen I. The fabrication of silicon nanostructures by local gallium implantation and cryogenic deep reactive ion etching. Nanotechnology 2009, 20, 065307: 1-5.

[4] de Boer M. J., Gardeniers J. G. E., Jansen H. V., Smulders E., Gilde M. J., Roelofs G., Sasserath J. N. and Elwenspoek M. Guidelines for etching silicon MEMS structures using fluorine high-density plasmas at cryogenic temperatures. Journal of Microelectromechanical Systems 2002, 11: 385-401.

[5] Frey L., Lehrer C. and Ryssel H. Nanoscale effects in focused ion beam processing. Applied Physics A: Materials Science & Processing 2003, 76: 1017-1023.

[6] Gates B. D., Xu Q., Stewart M., Ryan D., Willson C. G. and Whitesides G. M. New approaches to nanofabrication: molding, printing, and other techniques. Chem Rev 2005, 105: 1171-1196.

[7] Gierak J., Mailly D., Hawkes P., Jede R., Bruchhaus L., Bardotti L., Prével B., Mélinon P., Perez A., Hyndman R., Jamet J. P., Ferré J., Mougin A., Chappert C., Mathet V., Warn P. and Chapman J. Exploration of the ultimate patterning potential achievable with high resolution focused ion beams. Applied Physics A: Materials Science & Processing 2005, 80: 187-194.

[8] Henry M. D., Walavalkar S., Homyk A. and Scherer A. Alumina etch masks for fabrication of high-aspect-ratio silicon micropillars and nanopillars. Nanotechnology 2009, 20, 255305: 1-4.

[9] Jansen H. V., de Boer M. J., Unnikrishnan S., Louwerse M. C. and Elwenspoek M. C. Black silicon method X: a review on high speed and selective plasma etching of silicon with profile control: an in-depth comparison between Bosch and cryostat DRIE processes as a roadmap to next generation equipment. Journal of Micromechanics and Microengineering 2009, 19, 033001: 1-41.

[10] Kato N. I., Kohno Y. and Saka H. Side-wall damage in a transmission electron microscopy specimen of crystalline Si prepared by focused ion beam etching. American Vacuum Society 1999, 17: 1201-1204.

[11] Marrian C. R. K. and Tennant D. M. Nanofabrication. Journal of Vacuum Science & Technology A: Vacuum, Surfaces, and Films 2003, 21: S207-S215.

[12] Melngailis J., Mondelli A. A., Berry Iii I. L. and Mohondro R. A review of ion projection lithography. Journal of Vacuum Science & Technology B: Microelectronics and Nanometer Structures 1998, 16: 927-957.

[13] Mosher L., Waits C. M., Morgan B. and Ghodssi R. Double-Exposure Grayscale Photolithography. Journal of Microelectromechanical Systems 2009, 18: 308-315.

[14] Qian H. X., Wei Z., Jianmin M., Lennie E. N. L. and Zeng X. R. Fabrication of Si microstructures using focused ion beam implantation and reactive ion etching. Journal of Micromechanics and Microengineering 2008, 18, 035003: 1-5.

[15] Schmidt B., Bischoff L. and Teichert J. Writing FIB implantation and subsequent anisotropic wet chemical etching for fabrication of 3D structures in silicon. Sensors and Actuators A: Physical 1997, 61: 369-373.

[16] Schmidt B., Oswald S. and Bischoff L. Etch Rate Retardation of $Ga^+$-Ion Beam-Irradiated Silicon. Journal of The Electrochemical Society 2005, 152: G875-G879.

[17] Sunkara M. K., Sharma S., Miranda R., Lian G. and Dickey E. C. Bulk synthesis of silicon nanowires using a low-temperature vapor-liquid-solid method. Applied Physics Letters 2001, 79: 1546-1548.

[18] Tseng A. A. Recent developments in micromilling using focused ion beam technology. Journal of Micromechanics and Microengineering 2004, 14: R15-R34.

[19] Tseng A. A., Insua I. A., Park J. S., Li B. and Vakanas G. P. Milling of submicron channels on gold layer using double charged arsenic ion beam. Journal of Vacuum Science & Technology B: Microelectronics and Nanometer Structures 2004, 22: 82-89

[20] Watt F. Bettiol A. A., van Kan J. A., Teo E. J. and Breese M. B. H. Ion Beam Lithography and Nanofabrication: A Review. International Journal of Nanoscience 2005, 4: 269-286.

[21] Zhou Z. and Lee S. H. (2008) Two-beam-current method for e-beam writing gray-scale masks and its application to high-resolution microstructures. Appl. Opt. 2008, 47: 3177-3184.

[22] Ziegler J. F., Biersack J. P. and Littmark U. The stopping and range of ions in solids. (New York: Pergamon, 1985)

[23] Lugstein A., Basnar B., Smoliner J. and Bertagnolli E. FIB processing of silicon in the nanoscale regime. Applied Physics A Materials Science & Processing 2003, 76: 545-548.

[24] Henry M. D., Shearn M. J., Chhim B. and Scherer A. $Ga^+$ beam lithography for nanoscale silicon reactive ion etching. Nanotechnology 2010, 21, 245303.

[25] Sievilä P., Chekurov N., Tittonen I. The fabrication of silicon nanostructures by focused-ion-beam implantation and TMAH wet etching. Nanotechnology 2010, 21, 145301.

[26] Tachi S., Tsujimoto K., and Okudaira S. Engineering 1987: 616-618.

[27] Mellhaoui X., Dussart R., Tillocher T., Lefaucheux P., and Ranson P. Journal Of Applied Physics 2005, 98: 1-10.

[28] Ekinci K. L. and Roukes M. L. Nanoelectromechanical systems. Review Of Scientific Instruments 2005, 76, 061101: 1-12.

[29] Eichenfield M., Chan J., Camacho R. M., Vahala K. J., and Painter O. Optomechanical crystals. Nature 2009, 462: 78-82.

[30] Olesinski R. W., Kanani N., Abbaschian G. J. Bulletin of Alloy Phase Diagrams 1985, 6: 362-364.

[31] Hoshikawa, T., Huang, X., Hoshikawa, K., and Uda, Satoshi. Japanese Journal of Applied Physics 2008, vol. 47, no. 12, pp. 8691-8695.

What is claimed is:

1. A method for fabricating a desired structure in and/or on a host material, comprising:
   providing shapes to define the desired structure in and/or on the host material;
   defining one or more etch masks in and/or on the host material via addition or removal of a masking material according to each of the shapes;
   etching the host material with an etch chemistry to fabricate the desired structure, wherein the etch chemistry selectively etches the host material with respect to the one or more etch masks and selectively etches regions of the host material associated with at least one shape in the desired structure but absent the one or more etch masks; and
   iteratively performing the defining and the etching to fabricate the desired structure.

2. The method according to claim 1, wherein the defining comprises:
   providing one or more layers of the host material, wherein particular locations within each of the one or more layers of the host material are doped with the masking material according to each of the shapes.

3. The method according to claim 2, wherein the defining further comprises:
   determining a threshold dose,
   wherein dose of the masking material in said particular locations is above the threshold dose.

4. The method according to claim 3, wherein the determining comprises:
   implanting or depositing a plurality of doses in or on a sample area;
   etching the sample area for an arbitrarily small amount of time; and
   determining a dose for which failure of masking occurs for said arbitrarily small amount of time, thus determining the threshold dose.

5. The method according to claim 2, wherein the providing one or more layers comprises, for each layer in the one or more layers:
   depositing a layer of the host material; and
   implanting the masking material into the particular locations of the layer.

6. The method according to claim 5, wherein the depositing is selected from the group consisting of chemical vapor deposition, thermal evaporation, atomic layer deposition, and sputtering.

7. The method according to claim 2, wherein the providing one or more layers comprises, for at least one layer in the one or more layers, diffusion of the masking material into the particular locations in the host material.

8. The method according to claim 2, wherein the host material is silicon, and wherein the providing one or more layers comprises, for each layer, one or more of ion implantation, diffusion, or doped polysilicon growth.

9. The method according to claim 1, wherein the host material is selected from the group consisting of silicon, silicon carbide, silica, silicon nitride, silicon-germanium, germanium, amorphous carbon, graphite, diamond, carbon nanotubes, organic compounds, photoresists, polydimethylsiloxane (PDMS), and tungsten.

10. The method according to claim 1, wherein the masking material is selected from the group consisting of silicon, gallium, indium, gold, boron, and aluminum.

11. The method according to claim 1, wherein the addition or removal of the masking material is performed using ion implantation.

12. The method according to claim 1, wherein the addition or removal of the masking material is performed using diffusion.

13. The method according to claim 1, wherein the etch chemistry is a fluorinated etch chemistry.

14. The method according to claim 1, wherein the etch chemistry includes substrate sidewall passivation.

15. The method according to claim 1, further comprising, after the etching, removing the masking material.

16. The method according to claim 15, wherein the removing is selected from the group consisting of wet chemical etching, dry chemical etching, annealing, gettering, kelating, chemical mechanical polishing, physical removal, and cleaning.

17. The method according to claim 1, further comprising, after the iteratively performing the defining and the etching, removing the masking material.

* * * * *

UNITED STATES PATENT AND TRADEMARK OFFICE
CERTIFICATE OF CORRECTION

| | | |
|---|---|---|
| PATENT NO. | : 8,557,613 B2 | Page 1 of 1 |
| APPLICATION NO. | : 13/159335 | |
| DATED | : October 15, 2013 | |
| INVENTOR(S) | : Michael Shearn, Michael David Henry and Axel Scherer | |

It is certified that error appears in the above-identified patent and that said Letters Patent is hereby corrected as shown below:

In the Specification

In column 1, line 25 - 29, the following wording should appear:

This invention was made with government support under Grant No. HR0011-04-1-0054 awarded by DARPA, Grant No. EEC0812072 & Grant No. DMR0120967 awarded by the NSF, and Grant No. W911NF-07-1-0277 awarded by the ARO. The government has certain rights in the invention.

Signed and Sealed this
Fourth Day of March, 2014

Michelle K. Lee
*Deputy Director of the United States Patent and Trademark Office*